US012684961B2

(12) United States Patent
Hong et al.

(10) Patent No.: US 12,684,961 B2
(45) Date of Patent: Jul. 14, 2026

(54) ORGANIC LIGHT EMITTING DISPLAY DEVICE INCLUDING DISPLAY PAD IN PAD AREA

(71) Applicant: LG Display Co., Ltd., Seoul (KR)

(72) Inventors: Hyunseok Hong, Paju-si (KR); Soobin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 373 days.

(21) Appl. No.: 18/454,503

(22) Filed: Aug. 23, 2023

(65) Prior Publication Data

US 2024/0260338 A1 Aug. 1, 2024

(30) Foreign Application Priority Data

Jan. 27, 2023 (KR) ........................ 10-2023-0010533

(51) Int. Cl.
*H10K 59/12* (2023.01)
*H10K 59/121* (2023.01)
(Continued)

(52) U.S. Cl.
CPC ....... *H10K 59/124* (2023.02); *H10K 59/1201* (2023.02); *H10K 59/1213* (2023.02);
(Continued)

(58) Field of Classification Search
CPC .. H10K 59/124; H10K 59/1213; H10K 59/40; H10K 59/00; H10K 59/131;
(Continued)

(56) References Cited

U.S. PATENT DOCUMENTS 10,566,395 B2 2/2020 Lee et al.
10,777,620 B2 9/2020 Won et al.
(Continued)

FOREIGN PATENT DOCUMENTS

JP 2018-205718 A 12/2018
JP 2018-205744 A 12/2018
(Continued)

OTHER PUBLICATIONS

The Japan Patent Office, Office Action, Japanese Patent Application No. 2023-146644, May 23, 2024, 15 pages.

*Primary Examiner* — Ida M Soward
(74) *Attorney, Agent, or Firm* — Fenwick & West LLP

(57) ABSTRACT

An organic light emitting display device and a method for manufacturing the same is disclosed. The organic light emitting display device includes a first inorganic insulation layer on a display area and a pad area of a substrate, a first gate electrode and a first pad electrode on the first inorganic insulation layer in the display area and the pad area respectively, a second inorganic insulation layer covering the first gate electrode and a portion of the first pad electrode and having an opening, an organic insulation layer on the second inorganic insulation layer in the display area, a light emitting element on the organic insulation layer, an encapsulation layer covering the light emitting element, and a second pad electrode on the second inorganic insulation layer in the pad area and connected to the first pad electrode through the opening.

20 Claims, 11 Drawing Sheets

(51) Int. Cl.
  *H10K 59/124*  (2023.01)
  *H10K 59/40*  (2023.01)
  *H10K 50/844*  (2023.01)
  *H10K 59/122*  (2023.01)

(52) U.S. Cl.
  CPC ........... *H10K 59/40* (2023.02); *H10K 50/844* (2023.02); *H10K 59/122* (2023.02)

(58) Field of Classification Search
  CPC ...... H10K 59/12; H10K 59/875; H10K 59/82; H10K 59/88; H10K 59/122; H10K 50/844; G09F 9/335; G09F 3/0412; G09F 3/044; H10D 86/40; H10D 86/441; H10D 86/60
  See application file for complete search history.

(56)    References Cited

U.S. PATENT DOCUMENTS

| | | | |
|---|---|---|---|
| 10,818,738 B2 | 10/2020 | Lee et al. | |
| 10,971,571 B2 | 4/2021 | Won et al. | |
| 11,301,100 B2 | 4/2022 | Won et al. | |
| 11,569,310 B2 | 1/2023 | Lee et al. | |
| 11,600,686 B2 | 3/2023 | Won et al. | |
| 11,882,740 B2 | 1/2024 | Won et al. | |
| 2007/0075313 A1* | 4/2007 | Kwak | H10D 86/60 |
| | | | 257/E27.111 |
| 2017/0090651 A1 | 3/2017 | Kang et al. | |
| 2017/0358642 A1* | 12/2017 | Jo | G06F 3/0412 |
| 2018/0040837 A1* | 2/2018 | Seo | H10K 77/111 |
| 2018/0329552 A1* | 11/2018 | Song | G06F 3/0416 |
| 2018/0350884 A1* | 12/2018 | Won | H10K 71/00 |
| 2018/0358413 A1* | 12/2018 | Lee | H10K 77/111 |
| 2019/0036073 A1 | 1/2019 | Yu et al. | |
| 2019/0131379 A1 | 5/2019 | Won et al. | |
| 2020/0135813 A1 | 4/2020 | Lee et al. | |
| 2020/0152707 A1* | 5/2020 | Won | G06F 3/0443 |
| 2020/0373362 A1 | 11/2020 | Won et al. | |
| 2021/0005678 A1 | 1/2021 | Lee et al. | |
| 2021/0134923 A1 | 5/2021 | Kim et al. | |
| 2021/0193787 A1 | 6/2021 | Won et al. | |
| 2021/0202917 A1* | 7/2021 | Lee | H10K 59/122 |
| 2021/0242284 A1* | 8/2021 | Kim | G06F 3/0412 |
| 2022/0006041 A1* | 1/2022 | Seo | H10K 59/80521 |
| 2022/0043534 A1* | 2/2022 | Lee | H10K 59/8731 |
| 2022/0123076 A1* | 4/2022 | Kim | H10K 59/88 |
| 2022/0164066 A1* | 5/2022 | Chu | H10K 59/60 |
| 2022/0199691 A1* | 6/2022 | Shin | G06F 3/0446 |
| 2022/0206620 A1* | 6/2022 | Lee | G06F 3/0412 |
| 2022/0231090 A1* | 7/2022 | Byun | G06F 3/0412 |
| 2022/0262866 A1* | 8/2022 | Kim | H10K 59/131 |
| 2022/0415980 A1* | 12/2022 | Lee | H10K 59/122 |
| 2023/0172019 A1 | 6/2023 | Won et al. | |
| 2023/0214035 A1* | 7/2023 | Song | G06F 3/0412 |
| | | | 345/173 |
| 2023/0359295 A1* | 11/2023 | Lee | G06F 3/04164 |

FOREIGN PATENT DOCUMENTS

| | | | |
|---|---|---|---|
| JP | 2019-083195 A | 5/2019 | |
| KR | 10-2020-0080753 A | 7/2020 | |

* cited by examiner 141   510   332   722   162   191

DPAD'

ORGANIC LIGHT EMITTING DISPLAY DEVICE INCLUDING DISPLAY PAD IN PAD AREA

CROSS-REFERENCE TO RELATED APPLICATION

This application claims priority from Republic of Korea Patent Application No. 10-2023-0010533, filed on Jan. 27, 2023, which is hereby incorporated by reference in its entirety.

BACKGROUND

Field

Embodiments of the disclosure relate to an organic light emitting display device and a method for manufacturing the same.

Description of Related Art

As information technology develops, the market for display devices, which are user-to-information connecting media, is growing. Accordingly, the use of display devices, such as organic light emitting displays (OLEDs) and liquid crystal displays (LCDs), is increasing.

A display device includes a display panel including a plurality of subpixels disposed in a matrix form and a driving unit driving the display panel. The driving unit includes a scan driving unit for supplying scan signals (or gate signals) to the display panel and a data driving unit for supplying data signals to the display panel. If the scan signal and data signal are supplied to the subpixels disposed in a matrix form, the display device may display an image as the selected subpixels emit light.

The display device configures an interface with the user using various input devices. Demand for an input device that is convenient, simple, and capable of reducing malfunctions is increasing day by day. Accordingly, a touch element through which the user directly touches the screen to input information has been proposed. In particular, when applied to the organic light emitting display device, the touch element may be formed on the encapsulation layer for protecting the light emitting unit of the organic light emitting display device.

BRIEF SUMMARY

For cost reduction and structural convenience of driving integrated circuits (ICs) that drive subpixels and touch elements, a chip on panel (COP) for attaching the driving IC to the substrate of the display panel is desired.

To implement a COP, a display pad is disposed in the pad area of the non-display area. To reduce the number of processes and manufacturing costs, a pad electrode of the display pad, along with the conductive layer, is formed on the same layer as the conductive layer in the process of forming the conductive layer in the display area. For example, in the process of forming the source and drain electrodes of the display area, a first pad electrode of the display pad is formed on the same layer as the source and drain electrodes, in the process of forming the connection electrode to connect the driving transistor of the display area and the light emitting element, a second pad electrode of the display pad is formed on the same layer as the connection electrode, and in the process of forming the touch sensor layer of the display area, a third pad electrode of the display pad is formed on the same layer as the touch sensor layer. A planarization layer formed of a photosensitive organic insulating material covering the connection electrode is formed on the second pad electrode, and an opening is formed in the planarization layer to expose the second pad electrode.

Since the planarization layer is formed of the photosensitive organic material so that one time of patterning is possible, an opening for exposing the second pad electrode is formed in the process of forming a hole to connect the connection electrode and the driving transistor. Accordingly, an etching process for patterning the anode electrode of the light emitting element may be performed with the second pad electrode exposed through the opening. In this case, metal scum may be formed due to the Galvanic effect between the metal (e.g., Al) used for the second pad electrode and the metal (e.g., Ag) used as the material of the anode electrode in the process of patterning the anode electrode, causing a short circuit between the anode electrode and cathode electrode of the light emitting element, with the result of a dark spot.

Further, as the planarization layer is formed of an organic insulating material, adhesivity of the inorganic insulation layers there above and thereunder may be weakened, causing detachment. Thus, the pad electrodes constituting the display pad may peel off, leading to failure in transfer of the signal from the driving IC mounted on the display pad to the display area.

According to embodiments of the disclosure, there may be provided an organic light emitting display device and manufacturing method thereof, which may prevent metal scum and resultant dark spots.

According to embodiments of the disclosure, there may be provided an organic light emitting display device and a manufacturing method thereof, which may prevent the insulation layers around the display pad from lifting and resultant peel-off of the pad electrodes of the display pad and failure in transfer of the signal from the driving IC mounted on the display pad to the display area.

Objects of the present invention are not limited to the foregoing, and other unmentioned objects would be apparent to one of ordinary skill in the art from the following description.

In one embodiment, an organic light emitting display device comprises: a first inorganic insulation layer on a display area and a pad area of a substrate; a first gate electrode of a first transistor and a first pad electrode on the first inorganic insulation layer, the first gate electrode in the display area and the first pad electrode in the pad area; a second inorganic insulation layer covering the first gate electrode in the display area and covering a portion of the first pad electrode in the pad area, the second inorganic insulation layer having an opening; an organic insulation layer on the second inorganic insulation layer in the display area; a light emitting element on the organic insulation layer in the display area; an encapsulation layer covering the light emitting element in the display area; a touch sensor layer on the encapsulation layer in the display area; a second pad electrode on the second inorganic insulation layer and the first pad electrode in the pad area, the second pad electrode connected to the first pad electrode through the opening; and a display pad including the first pad electrode and the second pad electrode.

In one embodiment, an organic light emitting display device comprises: a substrate including a display area and a pad area; a first inorganic insulation layer on the display area and the pad area of the substrate; a first pad electrode on the first inorganic insulation layer in the pad area; a second inorganic insulation layer on the first inorganic insulation layer and the first pad electrode in the pad area, the second inorganic insulation layer having an opening; a second pad electrode on the second inorganic insulation layer and the first pad electrode in the pad area, the second pad electrode connected with the first pad electrode through the opening; and a display pad including the first pad electrode and the second pad electrode.

In one embodiment, a method for manufacturing an organic light emitting display device comprises: forming a first inorganic insulation layer on a substrate, the substrate including a display area and a pad area; forming a first gate electrode of a first transistor on the first inorganic insulation layer in the display area and a first pad electrode on the first inorganic insulation layer in the pad area; forming a second inorganic insulation layer on the first inorganic insulation layer, the second inorganic insulation layer covering the first gate electrode in the display area and the first pad electrode in the pad area; forming an organic insulation layer on the second inorganic insulation layer in the display area; forming a light emitting element on the organic insulation layer in the display area; forming an encapsulation layer covering the light emitting element in the display area; forming an opening in the second inorganic insulation layer of the pad area, the opening exposing a portion of the first pad electrode; and forming a touch sensor layer on the encapsulation layer in the display area and a second pad electrode on the second inorganic insulation layer and the first pad electrode in the pad area, the second pad electrode connected to the exposed portion of the first pad electrode through the opening in the second inorganic insulation layer.

In one embodiment, an organic light emitting display device comprises: a substrate including a display area and a pad area; a first inorganic insulation layer on the display area and the pad area; a driving transistor on the display area, the driving transistor including a first gate electrode that is on the first inorganic insulating layer; a second inorganic insulation layer on the first inorganic insulation layer in the display area and the pad area, the second inorganic insulation layer covering the first gate electrode in the display area; and a display pad in the pad area, the display pad including a first pad electrode on the first inorganic insulating layer in the pad area and a second pad electrode on the first pad electrode and the second inorganic insulating layer in the pad area, the second pad electrode connected with the first pad electrode through an opening in the second inorganic insulation layer in the pad area.

In one embodiment, a display device comprises: a substrate including a display area and a pad area; a first inorganic insulation layer on the display area and the pad area; a driving transistor on the display area, the driving transistor including a gate electrode that is on the first inorganic insulating layer in the display area; a second inorganic insulation layer on the first inorganic insulation layer in the display area and the pad area, the second inorganic insulation layer covering the first gate electrode in the display area; a light emitting element on the second inorganic insulation layer in the display area, the light emitting element connected to the driving transistor; a touch sensor layer on the light emitting element in the display area; a first pad electrode on the first inorganic insulation layer in the pad area and having ends that are covered by the second pad inorganic insulation layer in the pad area, the first pad electrode comprising a same material as the gate electrode of the driving transistor; and a second pad electrode on the second inorganic insulation layer in the pad area and connected with the first pad electrode via a hole in the second inorganic insulation layer in the pad area, the second pad electrode comprising a same material as the touch sensor layer.

According to embodiments of the disclosure, there may be provided an organic light emitting display device and manufacturing method thereof, in which the pad electrode of the display pad is formed on the same layer as the gate electrode of the first transistor (driving transistor), and the anode electrode of the light emitting element is patterned with the pad electrode of the display pad covered with the inorganic insulation layer on the gate electrode of the first transistor, thereby preventing metal scum from forming during the process of patterning the anode electrode and a short circuit between the anode electrode and cathode electrode of the light emitting element and resultant dark spots due to metal scum.

According to embodiments of the disclosure, there may be provided an organic light emitting display device and manufacturing method thereof, in which the inorganic insulation layers are disposed above and under the pad electrodes constituting the display pad to prevent the insulation layers around the pad electrode from lifting, preventing the pad electrodes of the display pad from peeling off due to lifting, and thus preventing failure in transfer of the signal from the driving IC mounted on the display pad to the display area due to the peel-off of the pad electrodes.

Objects of the present invention are not limited to the foregoing, and other unmentioned objects would be apparent to one of ordinary skill in the art from the following description.

BRIEF DESCRIPTION OF DRAWINGS

The above and other objects, features, and advantages of the present disclosure will be more clearly understood from the following detailed description, taken in conjunction with the accompanying drawings, in which.

DETAILED DESCRIPTION

Figure 1:
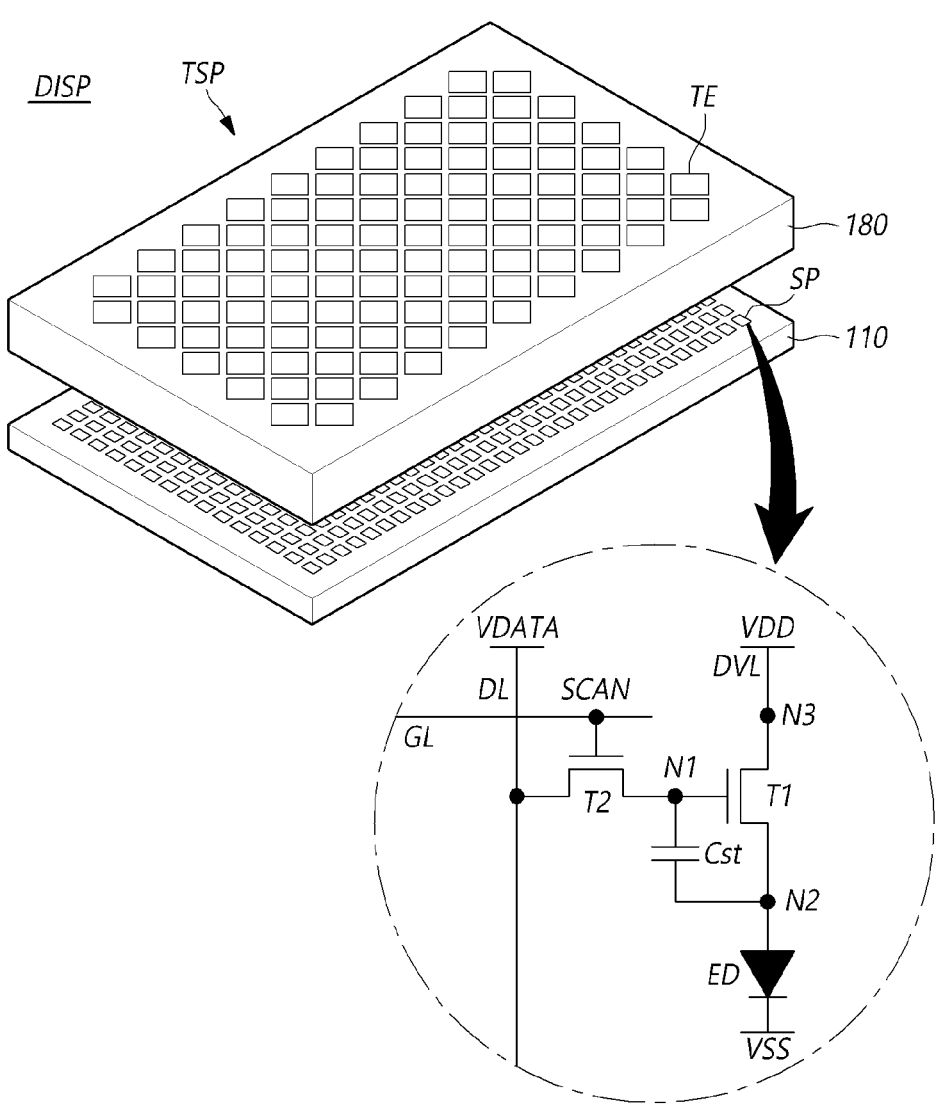
FIG. 1 is a perspective view illustrating a display panel of an organic light emitting display device according to embodiments of the disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 is a perspective view illustrating a display panel of an organic light emitting display device according to embodiments of the disclosure.

Referring to FIG. 1, an organic light emitting display device according to embodiments of the disclosure displays an image through unit pixels including light emitting elements. The organic light emitting display device detects a variation in mutual capacitance by the user's touch through the touch electrodes TE during a touch period, thereby sensing the presence/absence and position of a touch.

To that end, the display panel DISP includes a plurality of subpixels SP arranged in a matrix form on a substrate 110, an encapsulation layer 180 disposed on the plurality of subpixels SP, and a mutual capacitance Cm disposed on the encapsulation layer 180.

Each subpixel SP may include a light emitting element ED, a first transistor T1 for driving the light emitting element, a second transistor T2 for transferring a data voltage VDATA to a first node N1 of the first transistor T1, and a storage capacitor Cst for maintaining a constant voltage during one frame.

The first transistor T1 may include the first node N1 to which the data voltage may be applied, a second node N2 electrically connected with the light emitting element ED, and a third node N3 to which a driving voltage VDD is applied from a driving voltage line DVL. The first node N1 may be a gate node, the second node N2 may be a source node or a drain node, and the third node N3 may be the drain node or the source node. The first transistor T1 is referred to as a driving transistor for driving the light emitting element ED.

The light emitting element ED may include a first electrode (e.g., an anode electrode), a light emitting layer, and a second electrode (e.g., a cathode electrode). The first electrode may be electrically connected with the second node N2 of the first transistor T1, and a base voltage VSS may be applied to the second electrode.

The light emitting layer in the light emitting element ED may be an organic light emitting layer containing an organic material. In this case, the light emitting element ED may be an organic light emitting diode (OLED).

The second transistor T2 may be on/off controlled by a scan signal SCAN applied via the gate line GL and be electrically connected between the first node N1 of the first transistor T1 and the data line DL. The second transistor T2 is referred to as a switching transistor.

If the second transistor T2 is turned on by the scan signal SCAN, the data voltage VDATA supplied from the data line DL is transferred to the first node N1 of the first transistor T1. The storage capacitor Cst may be electrically connected between the first node N1 and second node N2 of the first transistor T1.

Each subpixel SP may have a 2T1C structure which includes two transistors T1 and T2 and one capacitor Cst as shown in FIG. 1 and, in some cases, each subpixel SP may further include one or more transistors or one or more capacitors.

The storage capacitor Cst may be not the parasitic capacitor (e.g., Cgs or Cgd), the internal capacitor which may be present between the first node N1 and second node N2 of the first transistor T1, but an external capacitor intentionally designed outside the first transistor T1.

Each of the first transistor T1 and the second transistor T2 may be an n-type transistor or a p-type transistor.

As described above, circuit elements, such as the light emitting element ED, transistors T1 and T2, and capacitor Cst, are disposed on the display panel DISP. Since the circuit elements, particularly light emitting element ED, are vulnerable to external moisture or oxygen, an encapsulation layer 180 for preventing external moisture or oxygen from penetrating into the circuit elements may be disposed on the display panel DISP.

In the organic light emitting display device according to an embodiment, the touch panel TSP may be formed on the encapsulation layer 180. In other words, in the organic light emitting display device, the touch sensor layer including, e.g., the plurality of touch electrodes TE constituting the touch panel TSP, may be disposed on the encapsulation layer 180.

Upon touch sensing, a touch driving signal or touch sensing signal may be applied to the touch electrode TE. Upon touch sensing, an electric potential may be formed between the cathode electrode and the touch electrode TE disposed, with the encapsulation layer 180 interposed therebetween, causing unnecessary parasitic capacitance. Since the parasitic capacitance may deteriorate touch sensitivity, the distance between the touch electrode TE and the cathode electrode may be designed to be a predetermined value (e.g., 5 μm) or more considering, e.g., panel thickness, panel manufacturing process, and display performance, so as to reduce the parasitic capacitance. To that end, the thickness of the encapsulation layer 180 may be at least 5 μm or more, as an example.

Figure 2:
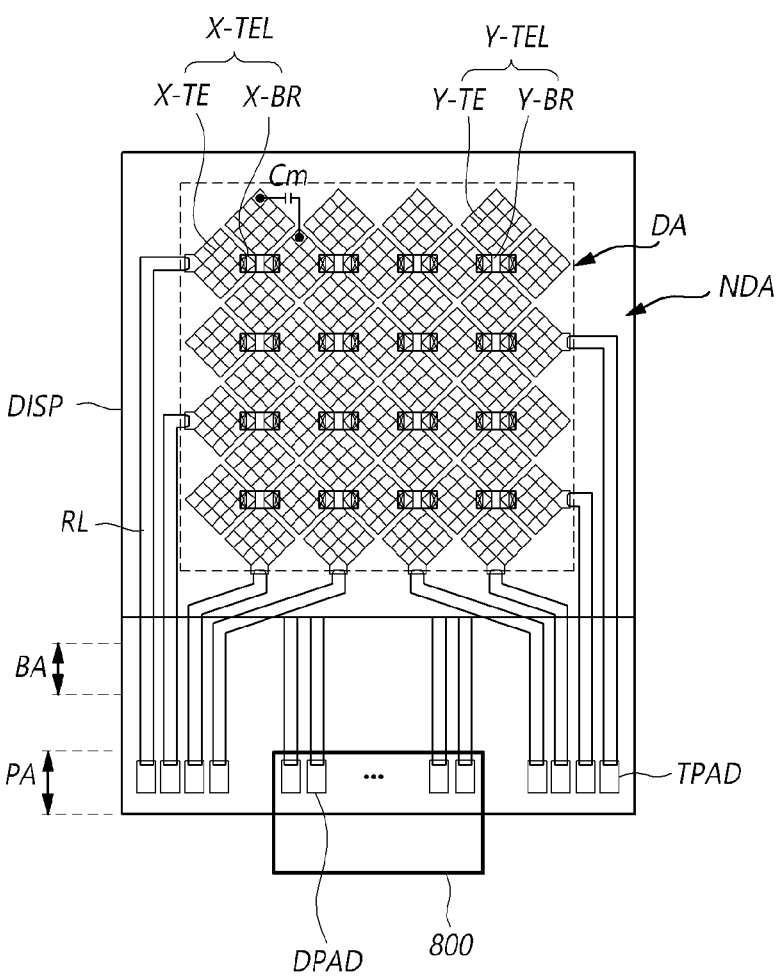
FIG. 2 is a plan view illustrating an organic light emitting display device according to embodiments of the disclosure.

FIG. 2 is a plan view illustrating an organic light emitting display device according to embodiments of the disclosure.

Referring to FIG. 2, the display panel DISP of the organic light emitting display device according to embodiments of the disclosure may include a display area DA and a non-display area NDA disposed at the edge of the display area DA. The display area DA is an area where a plurality of subpixels are arranged and is an area where images are displayed. The display area DA may also be referred to as an active area.

In the display area DA, a plurality of gate lines (not shown) and data lines (not shown) cross each other, defining a plurality of pixel areas. Further, a plurality of first touch lines Y-TEL and a plurality of second touch lines X-TEL may be disposed in the display area DA.

The plurality of first touch lines Y-TEL may include a plurality of first touch electrodes Y-TE and a plurality of first bridges Y-BR. The plurality of first touch electrodes Y-TE included in each first touch line Y-TEL may be spaced apart from each other at regular intervals along the Y-direction which is the first direction. The first touch electrode Y-TE may be electrically connected to an adjacent first touch electrode Y-TE through the first bridge Y-BR.

The plurality of second touch lines X-TEL may include a plurality of second touch electrodes X-TE and a plurality of second bridges X-BR. The plurality of second touch electrodes X-TE included in each second touch line X-TEL may be spaced apart from each other at regular intervals along the X-direction which is the second direction. The second touch electrode X-TE may be electrically connected to an adjacent second touch electrode X-TE through the second bridge X-BR.

The first and second touch electrodes Y-TE and X-TE and the first and second bridges Y-BR and X-BR may be formed in a mesh shape. Accordingly, the resistance and capacitance of the first and second touch electrodes Y-TE and X-TE and the first and second bridges Y-BR and X-BR may be reduced and a resistor-capacitor (RC) time constant may be reduced, so that touch sensitivity may be enhanced. Further, the line width of the mesh-shaped first and second touch electrodes Y-TE and X-TE and first and second bridges Y-BR and X-BR is very thin, so that it is possible to prevent degradation of the aperture ratio and transmittance due to the first and second touch electrodes Y-TE and X-TE and the first and second bridges Y-BR and X-BR.

A routing line RL may be connected to each of the first touch line Y-TEL and the second touch line X-TEL. The routing line RL may extend to at least one of the upper and lower sides of the display area DA and be connected to the touch pad TPAD disposed in the non-display area NDA. A touch sensing circuit (not shown) may be connected to the touch pad TPAD.

The routing line RL may transmit the touch driving pulse generated by the touch sensing circuit to the first touch line Y-TEL through the touch pad TPAD and may transmit the touch signal from the second touch line X-TEL to the touch sensing circuit through the touch pad TPAD.

The data driver circuit may be configured in the form of an integrated circuit (IC) and may be mounted in the non-display area NDA. FIG. 2 a driving IC 800 including a data driver circuit. For electrical connection with the driving IC 800, a display pad DPAD may be disposed in the non-display area NDA.

The non-display area NDA may include a pad area PA in which the touch pad TPAD and display pad DPAD are disposed and a bending area BA in which the display panel DISP may be bent or folded. The bending area BA corresponds to an area bent to allow the components with no display function, such as the touch pad TPAD, display pad DPAD, touch sensing circuit and driving IC 800, to be folded and positioned on the rear surface of the display area DA.

As shown in FIG. 2, the bending area BA may be disposed between the display area DA and the pad area PA. Further, the bending area BA may also be disposed inside at least one side of the upper, lower, left, and right sides of the non-display area NDA. Accordingly, the area occupied by the display area DA in the entire screen of the display device may be maximized while the non-display area NDA may be hidden behind the display area DA.

Figure 3:
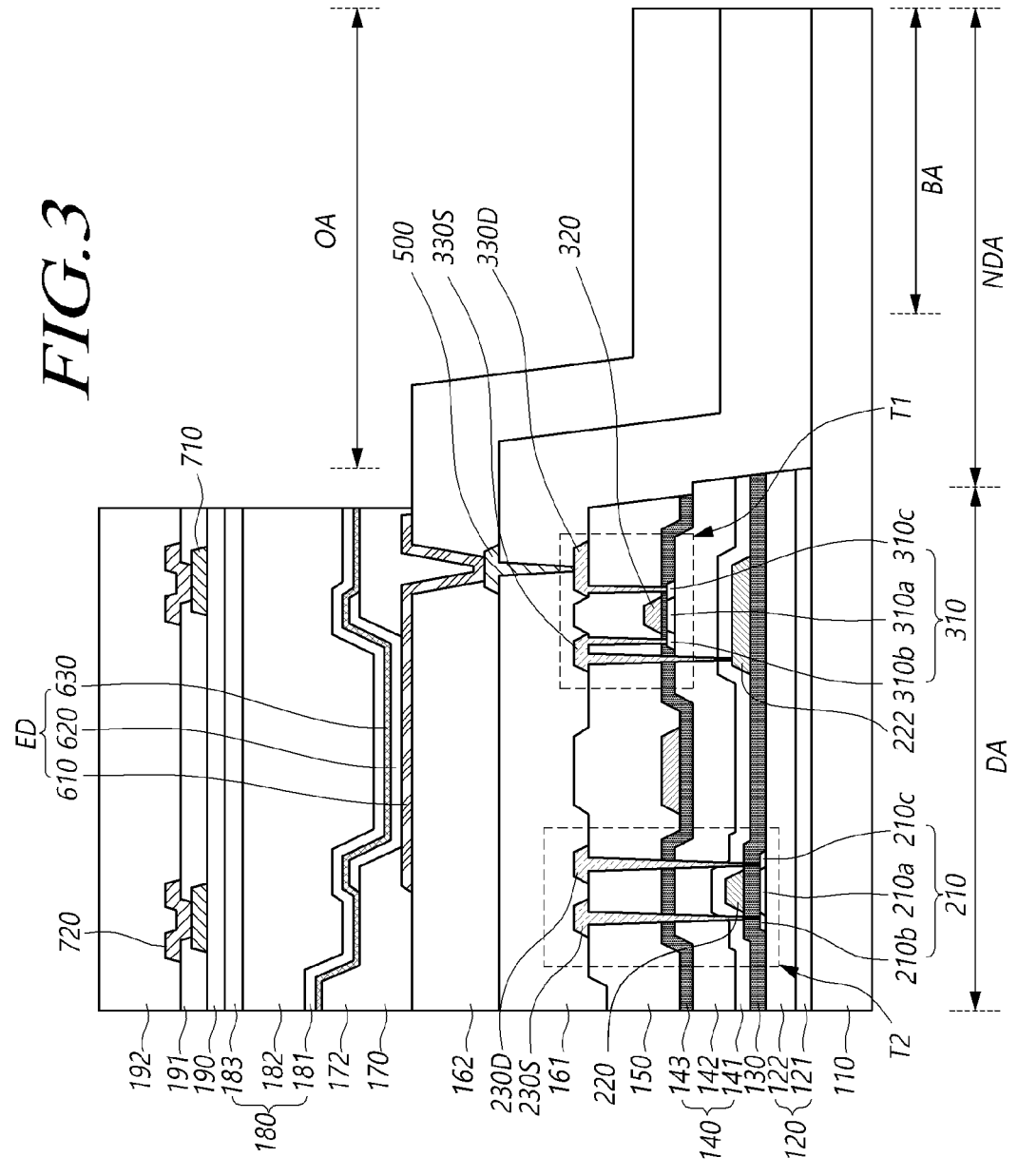
FIG. 3 is a cross-sectional view illustrating a display area and a bending area of an organic light emitting display device according to embodiments of the disclosure.

FIG. 3 is a cross-sectional view illustrating a display area and a bending area of an organic light emitting display device according to embodiments of the disclosure.

Referring to FIG. 3, a subpixel may include a first transistor T1, a second transistor T2, and a light emitting element ED. As described above in connection with FIG. 1, the first transistor T1 may be a driving transistor for driving the light emitting element ED, and the second transistor T2 may be a switching transistor.

Although one switching transistor is shown in FIG. 3, at least one or more switching transistors may be disposed in the subpixel. In other words, as the subpixel has various structures, such as 3T1C, 4T1C, 5T1C, 6T1C, and 7T1C, one or more switching transistors may be disposed.

The first transistor T1 may include a first semiconductor pattern 310, a first gate electrode 320 overlapping the first semiconductor pattern 310, a first source electrode 330S, and a first drain electrode 330D.

The first gate electrode 320 may be disposed on a first inorganic insulation layer 140. The first inorganic insulation layer 140 may be formed by stacking multiple layers of inorganic insulating materials, such as silicon oxide ($SiO_x$) and silicon nitride ($SiN_x$). For example, the first inorganic insulation layer 140 may include a first inter-layer insulation layer 141, an intermediate buffer layer 142, and a first gate insulation layer 143 that are sequentially stacked.

The first semiconductor pattern 310 may be disposed on the intermediate buffer layer 142. The first semiconductor pattern 310 may be formed of an oxide semiconductor material. The oxide semiconductor material may be formed of an oxide of a metal among zinc (Zn), indium (In), gallium (Ga), tin (Sn), and titanium (Ti) or a combination of a metal among zinc (Zn), indium (In), gallium (Ga), tin (Sn), and titanium (Ti) and its oxide. More specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

In the prior art, a polycrystalline semiconductor pattern that is advantageous for high-speed operation is used as an active layer of a driving transistor. However, a leakage current may occur in a driving transistor including a polycrystalline semiconductor pattern in an off state, resulting in power consumption. In particular, the power consumption in the off state becomes more problematic when the display device operates at low speed, such as displaying a still image, e.g., displaying a document, on the display device. Use of the oxide semiconductor pattern as the active layer of the driving transistor may contribute to blocking leakage current.

The first semiconductor pattern 310 may include a first channel area 310a and a first source area 310b and a first drain area 310c adjacent to the first channel area 310a, with the first channel area 310a interposed therebetween. The first channel area 310a may be formed of an intrinsic oxide semiconductor doped with no impurities. Further, the first source area 310b and the first drain area 310c may be conductive areas produced by doping an intrinsic oxide semiconductor with group 3 or group 5 impurity ions.

A first gate insulation layer 143 may be formed by depositing an inorganic insulating material, such as silicon oxide (SiO$_X$) and/or silicon nitride (SiN$_X$), on the first semiconductor pattern 310 and the intermediate buffer layer 142. The first gate insulation layer 143 may serve to protect and insulate the first semiconductor pattern 310 from the outside.

A first gate electrode 320 overlapping the first channel area 310a of the first semiconductor pattern 310 may be formed on the first gate insulation layer 143. The first gate electrode 320 may be formed of a metal material. For example, the first gate electrode 320 may be a single layer or a multi-layer structure formed of any one of, or an alloy of, molybdenum (Mo), aluminum (Al), chromium (Cr), gold (Au), titanium (Ti), nickel (Ni), neodymium (Nd), and copper (Cu), but is not limited thereto.

The second transistor T2 may include a second semiconductor pattern 210, a second gate electrode 220 overlapping the second semiconductor pattern 210, a second source electrode 230S, and a second drain electrode 230D.

The second semiconductor pattern 210 may be disposed on the lower buffer layer 120. The second semiconductor pattern 210 may include a second channel area 210a through which charges move, a second source area 210b and a second drain area 210c adjacent to the second channel area 210a with the second channel area 210a interposed therebetween. The second channel area 210a may be formed of a semiconductor doped with no impurities. Further, the second source area 210b and the second drain area 210c may be conductive areas produced by doping a semiconductor with group 3 or 5 impurity ions.

The lower buffer layer 120 may be disposed on the substrate 110. The substrate 110 may have a multi-layer structure in which organic films and inorganic films are alternately stacked. For example, the substrate 110 may be formed as organic films, such as polyimide, and inorganic films, such as silicon oxide (SiO$_2$), being alternately stacked.

The lower buffer layer 120 may include a first lower buffer layer 121 disposed on the substrate 110 and a second lower buffer layer 122 disposed on the first lower buffer layer 121. The first lower buffer layer 121 blocks moisture that may penetrate from the outside, and may be formed by stacking multiple layers of silicon oxide (SiO$_X$). The second lower buffer layer 122 may be formed of the same material as the first lower buffer layer 121.

A second gate insulation layer 130 may be formed by depositing an inorganic insulating material, such as silicon oxide (SiO$_X$) and/or silicon nitride (SiN$_X$), on the entire surface of the lower buffer layer 120 where the second semiconductor pattern 210 is formed. The second gate insulation layer 130 may serve to protect and insulate the second semiconductor pattern 210 from the outside.

A second gate electrode 220 overlapping the second channel area 210a of the second semiconductor pattern 210 may be formed on the second gate insulation layer 130. The second gate electrode 220 may be formed of a metal material. For example, the second gate electrode 220 may be a single layer or a multi-layer structure formed of any one of, or an alloy of, molybdenum (Mo), aluminum (Al), chromium (Cr), gold (Au), titanium (Ti), nickel (Ni), neodymium (Nd), and copper (Cu), but is not limited thereto.

The first inorganic insulation layer 140 may be disposed on the entire surface of the second gate insulation layer 130 where the second gate electrode 220 is formed. As described above, a first gate electrode 320 may be disposed on the first inorganic insulation layer 140.

A second inter-layer insulation layer 150 may be formed on the entire surface of the first inorganic insulation layer 140 where the first gate electrode 320 is formed. The second inter-layer insulation layer 150 may be formed by depositing a single layer or multiple layers of inorganic insulation films of silicon oxide (SiO$_X$) or/and silicon nitride (SiN$_X$). The second inter-layer insulation layer 150 may be referred to as a second inorganic insulation layer.

A first source electrode 330S, a first drain electrode 330D, a second source electrode 230S, and a second drain electrode 230D may be disposed on the second inter-layer insulation layer 150.

The second inter-layer insulation layer 150 and the first gate insulation layer 143 may have a hole to electrically connect each of the first source electrode 330S and the first drain electrode 330D to the first semiconductor pattern 310. The second inter-layer insulation layer 150, the first gate insulation layer 143, the intermediate buffer layer 142, the first inter-layer insulation layer 141, and the second gate insulation layer 130 may have a hole to electrically connect each of the second source electrode 230S and the second drain electrodes 230D to the second semiconductor pattern 210.

The organic light emitting display device according to an embodiment of the disclosure may further include a blocking layer 222. The blocking layer 222 may be disposed under the first semiconductor pattern 310 of the first transistor T1 to overlap the first semiconductor pattern 310. The blocking layer 222 may have an area larger than that of the first semiconductor pattern 310.

The blocking layer 222 may prevent or at least reduce the first semiconductor pattern 310 from malfunctioning when light incident from the outside of the light emitting display device is radiated to the first semiconductor pattern 310. The blocking layer 222 may prevent or at least reduce an inflow of charges from the substrate 110. For example, when a voltage is applied to the first gate electrode 320 for a long time, the back channel phenomenon may occur in which due to an electric field generated in the first transistor T1, the charge of the substrate 110 is introduced to the first channel area 310a of the first semiconductor pattern 310, changing the amount of charge in the first channel area 310a. The charges may be either holes or electrons depending on the polarity of the electric field. The substrate 110 may change the current of the first transistor T1 to cause a change in the threshold voltage of the first transistor T1. This may cause changes in the luminance of pixels and afterimages. The blocking layer 222 is disposed between the substrate 110 and the first semiconductor pattern 310 to block unwanted charges flowing from the substrate 110 to the first transistor T1, thereby preventing or at least reducing a change in the threshold voltage Vth of the first transistor T1 and resultant afterimages. It is possible to enhance display quality by securing the stability of the first transistor T1 during driving.

The blocking layer 222 may be disposed on the second gate insulation layer 130. The blocking layer 222 may be formed together with the second gate electrode 220 in the process of forming the second gate electrode 220. Accordingly, the blocking layer 222 may be formed of the same material as the second gate electrode 220 on the same layer as the second gate electrode 220. As the blocking layer 222 is formed through the same process as that of the second gate electrode 220, the number of processes and manufacturing costs may be reduced.

The blocking layer 222 may be electrically connected to the first source electrode 330S. Accordingly, the same voltage as that of the first source electrode 330S may be applied to the blocking layer 222. Since the voltage of the blocking layer 222 may be maintained at the same voltage as the voltage of the first source electrode 330S, a change in characteristics of elements disposed around the blocking layer 222 may be reduced. In other words, since the blocking layer 222 is less affected by an external voltage, a change in the threshold voltage Vth of the first transistor T1 due to a back channel phenomenon may be prevented or at least reduced. Although not shown, a blocking layer may also be disposed under the second transistor T2.

The second inter-layer insulation layer 150, the first gate insulation layer 143, the intermediate buffer layer 142, and the first inter-layer insulation layer 141 may have a hole to electrically connect the blocking layer 222 and the first source electrode 330S, and the first source electrode 330S may be disposed in the hole.

As shown in FIG. 3, an open portion OA may be formed in the bending area BA to easily bend the display panel. The open portion OA is formed by etching the inorganic insulation layers deposited in the bending area BA.

If the substrate 110 is bent, continuous bending stress is applied to the inorganic insulation layers 120, 130, 140, and 150 disposed in the bending area BA. Since the inorganic insulation layers 120, 130, 140, and 150 have lower elasticity than an organic insulating material, cracks may easily occur in the inorganic insulation layers 120, 130, 140, and 150. Cracks in the inorganic insulation layers 120, 130, 140, and 150 may spread to the display area DA along the inorganic insulation layers 120, 130, 140, and 150, resulting in line defects and device driving failure.

The open portion OA is created by removing a plurality of inorganic insulation layers 120, 130, 140, and 150 that may have cracks. Specifically, the open portion OA is created by removing the lower buffer layer 120, the second gate insulation layer 130, the first inorganic insulation layer 140, and the second inter-layer insulation layer 150 deposited in the bending area BA.

Planarization layers 161 and 162 may be disposed to cover the first transistor T1 and the second transistor T2. The planarization layers 161 and 162 may protect the transistors disposed thereunder and alleviate or flatten the steps caused by various patterns.

The planarization layers 161 and 162 may be formed of at least one or more of organic insulating materials, such as benzocyclobutene (BCB), acrylic resin, epoxy resin, phenolic resin, polyamide resin, or polyimide resin, but are not limited thereto. The planarization layers 161 and 162 may be disposed as a single layer, but may be disposed as a plurality of layers of two or more layers considering the arrangement of electrodes.

The planarization layers 161 and 162 may extend from the display area DA to the bending area BA, covering the bending area BA. The planarization layers 161 and 162 formed of an organic insulating material having higher elasticity than an inorganic insulating layer may be disposed in the bending area BA. The planarization layers 161 and 162 may prevent or at least reduce cracks from occurring by alleviating the bending stress generated when the substrate 110 is bent and may protect the lines disposed in the bending area BA.

This is due to the increase in various signal lines as display devices evolve to have a higher resolution. Therefore, it is difficult to arrange all the lines on one layer while securing the minimum interval. Thus, an additional layer is provided. The additional layer provides some leeway in the line layout, making line/electrode layout design easier. Further, when a dielectric material is used as a planarization layer composed of multiple layers, the planarization layer may be used for forming capacitance between metal layers.

When the planarization layers 161 and 162 are disposed as a plurality of layers, the planarization layers 161 and 162 may include a first planarization layer 161 and a second planarization layer 162. A connection electrode 500 may be disposed between the first planarization layer 161 and the second planarization layer 162.

A hole may be formed in the first planarization layer 161, and the connection electrode 500 may be disposed in the hole. The first transistor T1 and the light emitting element ED may be electrically connected through the connection electrode 500. For example, one end (or portion) of the connection electrode 500 may be connected to the first transistor T1, and the other end (or the other portion) of the connection electrode 500 may be connected to the light emitting element ED. The connection electrode 500 may include aluminum (Al).

The light emitting element ED may include a first electrode 610, a light emitting layer 620 and a second electrode 630 that are sequentially stacked. The first electrode 610 may be an anode electrode. The second electrode 630 may be a cathode electrode.

The first electrode 610 of the light emitting element ED may be disposed on the second planarization layer 162. The first electrode 610 may be connected to the connection electrode 500 through the hole provided in the second planarization layer 162 and may be electrically connected to the first drain electrode 330D through the connection electrode 500. The first electrode 610 may supply holes to the light emitting layer 620 and may be formed of a conductive material having a high work function.

When the organic light emitting display device is of a top emission type, the first electrode 610 may be disposed using an opaque conductive material as a reflective electrode that reflects light. For example, the first electrode 610 may be formed of at least one of silver (Ag), aluminum (Al), gold (Au), molybdenum (Mo), tungsten (W), chromium (Cr), or alloys thereof. For example, the first electrode 610 may have a three-layer structure of silver (Ag)/lead (Pb)/copper (Cu), but is not limited thereto.

A bank layer 170 may be disposed on the first electrode 610 and the second planarization layer 162. The bank layer 170 may divide a plurality of subpixels, reduce glare and prevent or at least reduce color mixing at various viewing angles. The bank layer 170 may have a bank hole to expose the first electrode 610 corresponding to the emission area.

The bank layer 170 may be formed of at least one or more of inorganic insulating materials, such as silicon nitride ($SiN_x$) or silicon oxide ($SiO_x$), or organic insulating materials, such as benzocyclobutene (BCB), acrylic resin, epoxy resin, phenolic resin, polyamide resin, or polyimide resin, but are not limited thereto.

A spacer 172 may be further disposed on the bank layer 170. The spacer 172 may buffer an empty space between the substrate 110 where the light emitting element ED is formed and the upper substrate, thereby reducing damage to the organic light emitting display device by impact from the outside. The spacer 172 may be formed of the same material as the bank layer 170 and may be formed simultaneously with the bank layer 170, but is not limited thereto.

The light emitting layer 620 may be disposed on the first electrode 610 and the bank layer 170. The light emitting layer 620 may include one of a red organic light emitting layer, a green organic light emitting layer, a blue organic light emitting layer, or a white organic light emitting layer to emit light of a specific color. When the light emitting layer 620 includes a white organic light emitting layer, a color filter for converting white light from the white organic light emitting layer into light of another color may be disposed on the light emitting element ED. Further, the light emitting layer 620 may include a hole injection layer, a hole transport layer, an electron transport layer, and an electron injection layer in addition to the organic light emitting layer, but is not limited thereto.

The second electrode 630 may be disposed on the light emitting layer 620. The second electrode 630 may supply electrons to the light emitting layer 620 and may be formed of a conductive material having a low work function.

When the light emitting display device is of a top emission type, the second electrode 630 may be disposed using a transparent conductive material that transmits light. For example, the second electrode 630 may be formed of at least one or more of indium tin oxide (ITO) and indium zinc oxide (IZO), but is not limited thereto.

Further, the second electrode 630 may be disposed using a translucent conductive material. For example, the second electrode 630 may be formed of at least one or more of alloys, such as LiF/Al, CsF/Al, Mg/Ag, Ca/Ag, Ca/Ag, LiF/Mg/Ag, LiF/Ca/Ag, and LiF/Ca/Ag, but is not limited thereto.

An encapsulation layer 180 may be disposed on the second electrode 630 of the light emitting element ED. The encapsulation layer 180 may protect the light emitting element ED from external moisture, oxygen, or foreign matter. For example, the encapsulation layer 180 may prevent or at least reduce penetration of oxygen and moisture from the outside to prevent or at least reduce oxidation of the light emitting material and the electrode material. The encapsulation layer 180 may be a single layer or may include multiple layers.

For example, when the encapsulation layer 180 is formed of a plurality of layers, the encapsulation layer 180 may include one or more inorganic encapsulation layers and one or more organic encapsulation layers. As a specific example, the encapsulation layer 180 may include a first inorganic encapsulation layer 181, an organic encapsulation layer 182, and a second inorganic encapsulation layer 183 that are sequentially stacked. Here, the organic encapsulation layer 182 may be positioned between the first inorganic encapsulation layer 181 and the second inorganic encapsulation layer 183.

The first inorganic encapsulation layer 181 and the second inorganic encapsulation layer 183 may be formed of at least one inorganic material among silicon nitride (SiNx), silicon oxide (SiOx), and aluminum oxide (AlyOz), but is not limited thereto. The first inorganic encapsulation layer 181 and the second inorganic encapsulation layer 183 may be formed using a vacuum deposition method, such as chemical vapor deposition (CVD) or atomic layer deposition (ALD), but is not limited thereto.

The second encapsulation layer (i.e., the organic encapsulation layer) 182 may cover foreign matter or particles that may be created in the manufacturing process. Further, the second encapsulation layer 182 may planarize the surface of the first inorganic encapsulation layer 181. For example, the second encapsulation layer 182 may be a particle cover layer, but is not limited by the term.

The second encapsulation layer 182 may be formed of an organic material, e.g., a polymer, such as silicon oxycarbon (SiOCz) epoxy, polyimide, polyethylene, or acrylate, but is not limited thereto. The second encapsulation layer 182 may be formed of a heat-curable material or a photo-curable material that is cured by heat or light.

A plurality of touch sensor layers 710 and 720 may be disposed on the encapsulation layer 180.

The plurality of touch sensor layers 710 and 720 include a plurality of first touch lines Y-TEL extending in the Y-axis direction and a plurality of second touch lines X-TEL extending in the X-axis direction to cross, without contacting, the first touch lines Y-TEL.

To arrange the plurality of first touch lines Y-TEL and the plurality of second touch lines X-TEL, the touch buffer layer 190 may be disposed on the encapsulation layer 180, the first touch sensor layer 710 may be disposed on the touch buffer layer 190, a touch insulation layer 191 covering the first touch sensor layer 710 may be disposed on the touch buffer layer 190, and the second touch sensor layer 720 may be disposed on the touch insulation layer 191.

The first touch sensor layer 710 includes, e.g., the plurality of first touch electrodes Y-TE and the plurality of first bridges Y-BR of the plurality of first touch lines Y-TEL and the plurality of second bridges X-BR of the plurality of second touch lines X-TEL. The second touch sensor layer 720 includes the plurality of second touch electrodes X-TE of the plurality of second touch lines X-TEL. The second bridge X-BR is exposed through a touch contact hole penetrating the touch insulation layer 191 and electrically connected to the second touch electrode X-TE.

The touch buffer layer 190 and the touch insulation layer 191 may be formed of an inorganic insulating material, such as silicon oxide ($SiO_X$) or/and silicon nitride ($SiN_X$). The touch buffer layer 190 may block penetration into the light emitting element ED including an organic material, of chemical solution (developer or etchant, etc.) used in the manufacturing process of the first and second touch sensor layers 710 and 720 or moisture from the outside. Further, the touch buffer layer 190 may prevent disconnection of the first and second touch sensor layers 710 and 720 disposed on the touch buffer layer 190 due to external impact and block interference signals that may be generated while driving the first and second touch sensor layers 710 and 720.

The planarization layer (i.e., a touch planarization layer) 192 may be disposed on the touch insulation layer 191 to cover the second touch sensor layer 720. The touch planarization layer 192 may be formed of at least one or more of organic insulating materials, such as benzocyclobutene (BCB), acrylic resin, epoxy resin, phenolic resin, polyamide resin, or polyimide resin, but is not limited thereto.

Figure 4:
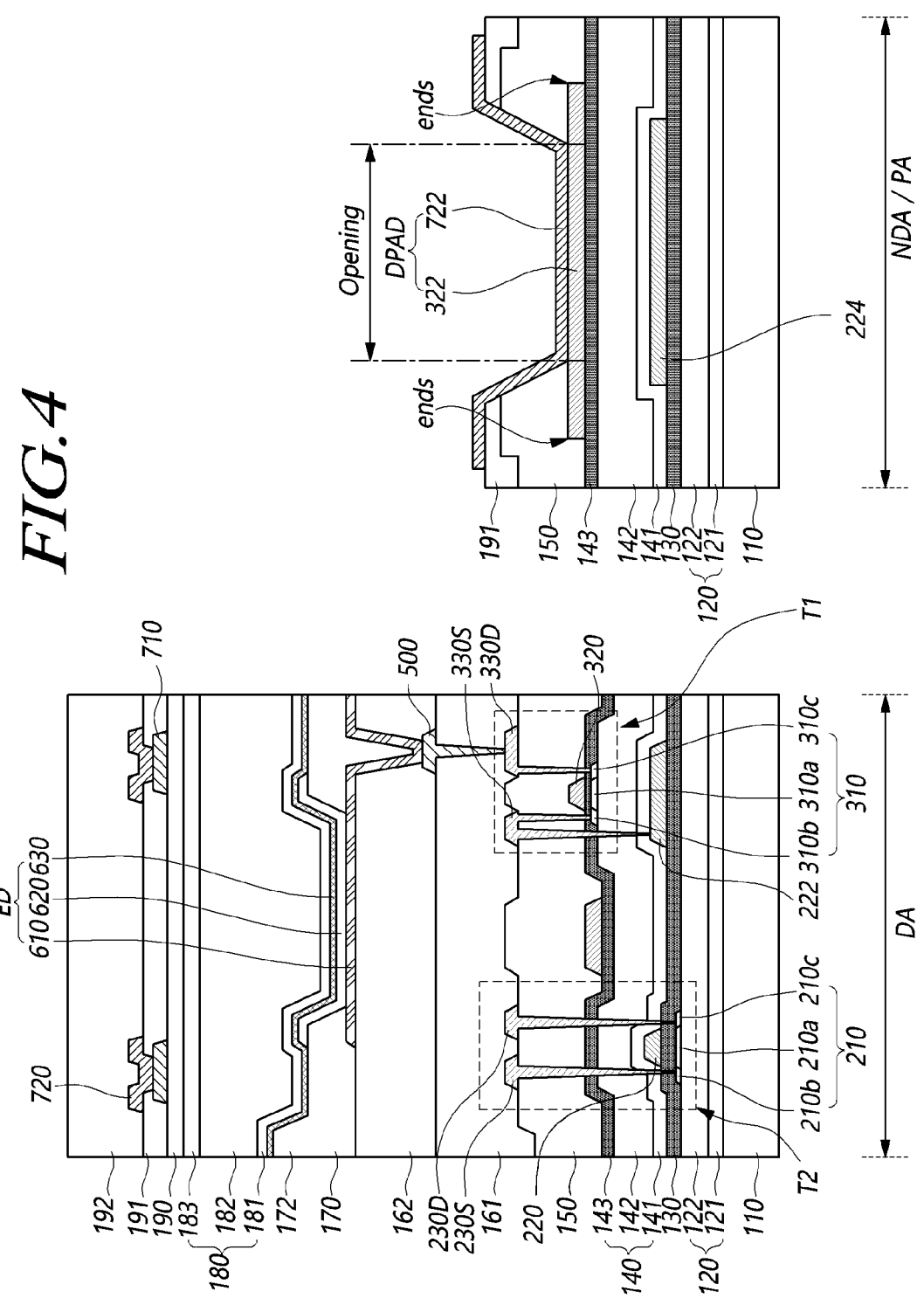
FIG. 4 is a cross-sectional view illustrating a display area and a pad area of an organic light emitting display device according to embodiments of the disclosure.

FIG. 4 is a cross-sectional view illustrating a display area DA and a pad area PA of an organic light emitting display device according to embodiments of the disclosure.

Referring to FIG. 4, a display pad DPAD may be disposed in the pad area PA of the substrate 110. Although not shown in FIG. 4, a driving IC may be mounted on the display pad DPAD.

The display pad DPAD may include a first pad electrode 322 and a second pad electrode 722.

The first pad electrode 322 may be formed together with the first gate electrode 320 in the process of forming the first gate electrode 320 of the first transistor T1 in the display area DA. Accordingly, the first pad electrode 322 may be formed of the same material as the first gate electrode 320 of the first transistor T1 on the same layer as the first gate electrode 320. The first gate electrode 320 of the first transistor T1 and the first pad electrode 322 may be disposed on the first gate insulation layer 143.

A second inter-layer insulation layer 150 covering the first pad electrode 322 may be disposed on the first gate insulation layer 143 in the pad area PA. A lower surface of the second inter-layer insulation layer 150 may contact an upper surface of the first gate insulation layer 143. The second inter-layer insulation layer 150 may be referred to as a second inorganic insulation layer. The first gate insulation layer 143 may form an upper surface of the first inorganic insulation layer 140. The second inorganic insulation layer may contact the upper surface of the first inorganic insulation layer 140. The second inter-layer insulation layer 150 may include an opening exposing at least a portion of the first pad electrode 322.

A touch insulation layer 191 may be disposed on the second inter-layer insulation layer 150 in the pad area PA. The touch insulation layer 191 may include an opening connected to the opening of the second inter-layer insulation layer 150. The second inter-layer insulation layer 150 and the touch insulation layer 191 may cover an edge (e.g., an end) of the first pad electrode 322 and expose a center portion of the first pad electrode 322.

A second pad electrode 722 may be disposed on the touch insulation layer 191. The second pad electrode 722 may be connected to the first pad electrode 322 through the opening. That is, the second pad electrode 722 may be in direct contact with the first pad electrode 322 in the opening.

The second pad electrode 722 may be formed together with the second touch sensor layer 720 in the process of forming the second touch sensor layer 720 in the display area DA. Accordingly, the second pad electrode 722 may be formed of the same material as the second touch sensor layer 720.

A dummy pad electrode 224 may be further disposed under the first pad electrode 322. The dummy pad electrode 224 may be disposed to overlap the first pad electrode 322.

The dummy pad electrode 224 may be formed together with the second gate electrode 220 in the process of forming the second gate electrode 220 of the second transistor T2 in the display area DA. Accordingly, the dummy pad electrode 224 may be formed of the same material, on the same layer, as the second gate electrode 220 of the second transistor T2 in the display area DA. The dummy pad electrode 224 may also be made of the same material and on the same layer as the light blocking layer 222.

FIGS. 5A, 5B, 5C, and 5D are cross-sectional views illustrating an organic light emitting display device per manufacturing step according to embodiments of the disclosure.

Figure 5A:
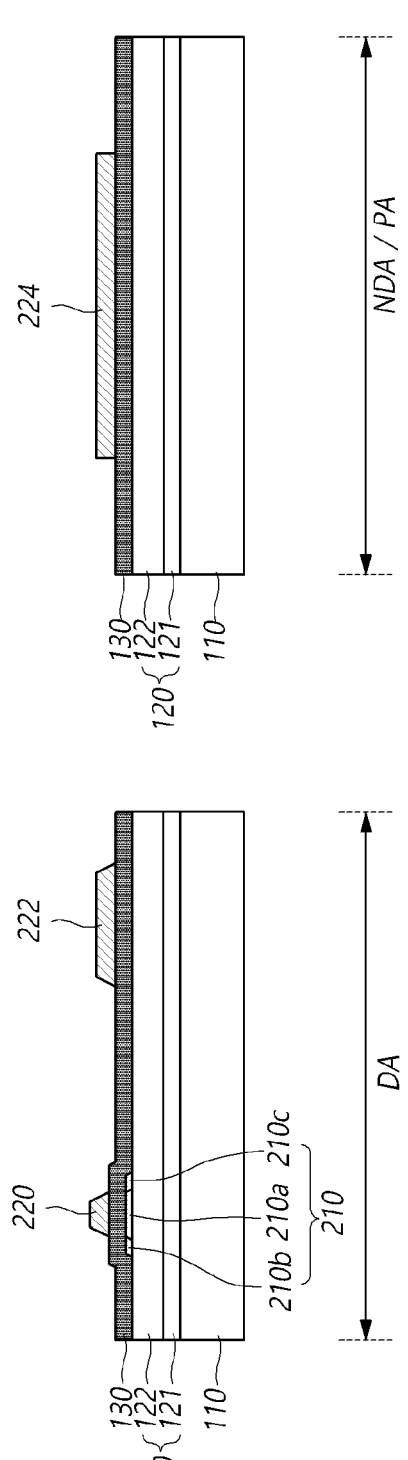
FIGS. 5A, 5B, 5C, and 5D are cross-sectional views illustrating an organic light emitting display device per manufacturing step according to embodiments of the disclosure.

Referring to FIG. 5A, the lower buffer layer 120 is formed on the substrate 110, and the second semiconductor pattern 210 is formed on the lower buffer layer 120.

The lower buffer layer 120 may include the first lower buffer layer 121 and the second lower buffer layer 122. The first lower buffer layer 121 and the second lower buffer layer 122 may be formed of the same material by the same method. The first lower buffer layer 121 and the second lower buffer layer 122 may be formed on the entire substrate including the display area DA and the non-display area NDA. The second semiconductor pattern 210 may include the second channel area 210a, the second source area 210b, and the second drain area 210c. The second channel area 210a may be formed of a semiconductor doped with no impurities. The second source area 210b and the second drain area 210c may be conductive areas produced by doping a semiconductor with group 3 or 5 impurity ions.

A second gate insulation layer 130 is formed by depositing an inorganic insulating material, such as silicon oxide ($SiO_x$) and/or silicon nitride ($SiN_x$), on the entire surface of the lower buffer layer 120 where the second semiconductor pattern 210 is formed. The second gate insulation layer 130 may serve to electrically insulate the second gate electrode 220 formed thereon and the second semiconductor pattern 210 from each other.

The second gate electrode 220 and the light blocking layer 222 are formed on the second gate insulation layer 130 in the display area DA. The second gate electrode 220 may be formed on the second channel area 210a. The light blocking layer 222 may be formed under the first transistor T1 which is to be formed later.

While the second gate electrode 220 is formed in the display area DA, the dummy pad electrode 224 is formed in the pad area PA. The dummy pad electrode 224 may be formed together with the second gate electrode 220 in the process of forming the second gate electrode 220 in the display area DA. Accordingly, the dummy pad electrode 224 may be formed of the same material, on the same layer, as the second gate electrode 220 in the display area DA.

The second gate electrode 220, the light blocking layer 222, and the dummy pad electrode 224 may be formed of a metal material. For example, the second gate electrode 220, the light blocking layer 222, and the dummy pad electrode 224 may be a single layer or a multi-layer structure formed of any one of, or an alloy of, molybdenum (Mo), aluminum (Al), chromium (Cr), gold (Au), titanium (Ti), nickel (Ni), neodymium (Nd), and copper (Cu), but is not limited thereto.

Figure 5B:
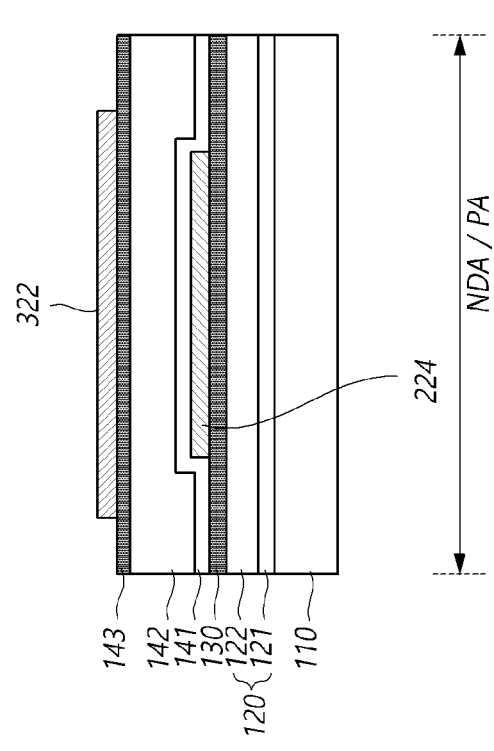
Figure 5B:
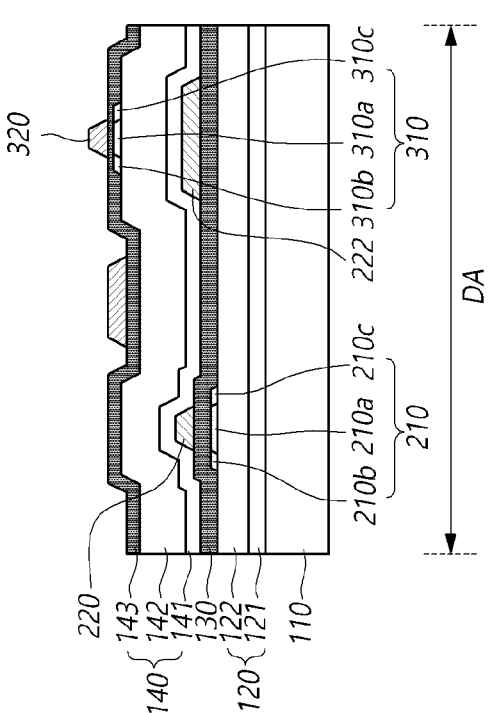

Referring to FIG. 5B, a first inorganic insulation layer 140 is formed on the second gate insulation layer 130 where the second gate electrode 220, the light blocking layer 222, and the dummy pad electrode 224 are formed. The first inorganic insulation layer 140 may be formed on the entire substrate including the display area DA and the non-display area NDA.

The first inorganic insulation layer 140 may be formed by depositing an inorganic insulating material including silicon nitride and/or silicon oxide in a single layer or multiple layers. For example, the first inorganic insulation layer 140 may include a first inter-layer insulation layer 141, an intermediate buffer layer 142, and a first gate insulation layer 143.

The first inter-layer insulation layer 141 is formed on the second gate insulation layer 130. The intermediate buffer layer 142 is formed on the first inter-layer insulation layer 141, and a first semiconductor pattern 310 is formed on the intermediate buffer layer 142. The first gate insulation layer 143 is formed on the intermediate buffer layer 142 where the first semiconductor pattern 310 is formed.

The first gate insulation layer 143 may serve to electrically insulate the first gate electrode 320 formed thereon and the first semiconductor pattern 310 from each other. The first gate insulation layer 143 may include an inorganic insulating material, such as silicon oxide ($SiO_X$) or/and silicon nitride ($SiN_X$). For example, the first gate insulation layer 143 may include a silicon nitride film containing hydrogen particles. In the process of heat-treating the first gate insulation layer 143 after forming the first gate insulation layer 143, hydrogen particles may diffuse and penetrate the first semiconductor pattern 310, thereby making the first semiconductor pattern 310 a conductor and hence forming a first source area 310b and a first drain area 310c.

The first gate electrode 320 is formed on the first gate insulation layer 143 in the display area DA. While the first gate electrode 320 is formed in the display area DA, the first pad electrode 322 of the display pad is formed in the pad area PA. The first pad electrode 322 may be formed together with the first gate electrode 320 in the process of forming the first gate electrode 320 in the display area DA. Accordingly, the first pad electrode 322 of the display pad may be formed of the same material, on the same layer, as the first gate electrode 320 in the display area DA.

The first gate electrode 320 and the first pad electrode 322 may be formed of a metal material. For example, the first gate electrode 320 and the first pad electrode 322 may be a single layer or a multi-layer structure formed of any one of, or an alloy of, molybdenum (Mo), aluminum (Al), chromium (Cr), gold (Au), titanium (Ti), nickel (Ni), neodymium (Nd), and copper (Cu), but is not limited thereto.

Figure 5C:
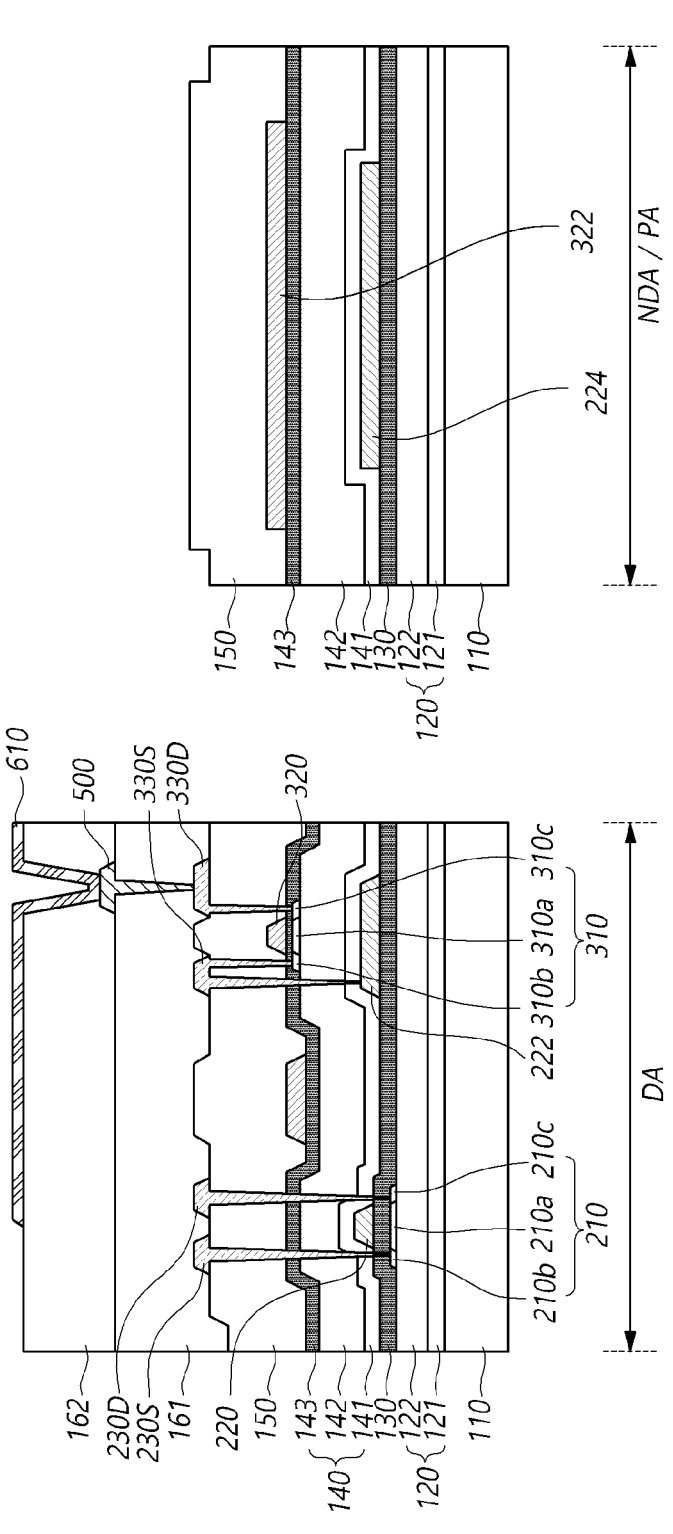

Referring to FIG. 5C, a second inter-layer insulation layer 150 covering the first gate electrode 320 and the first pad electrode 322 is formed on the first gate insulation layer 143. The second inter-layer insulation layer 150 may be formed on the entire substrate including the display area DA and the non-display area NDA. The second inter-layer insulation layer 150 may be formed by depositing a single layer or multiple layers of inorganic insulation films of silicon oxide ($SiO_X$) or/and silicon nitride ($SiN_X$).

Subsequently, holes exposing the first and second source areas 310b and 210b and the first and second drain areas 310c and 210c are formed. Next, the first and second source electrodes 330S and 230S and first and second drain electrodes 330D and 230D connected to the first and second source areas 310b and 210b and the first and second drain areas 310c and 210c, respectively, through the holes, may be formed.

Although not shown, the second inter-layer insulation layer 150, the first inorganic insulation layer 140, the second gate insulation layer 130, and the lower buffer layer 120 in the bending area are removed.

Subsequently, the first planarization layer 161 covering the first and second source electrodes 330S and 230S and the first and second drain electrodes 330D and 230D is formed on the entire substrate including the display area DA and the non-display area NDA.

For example, the first planarization layer 161 may planarize one surface of the substrate 110 where the metal electrodes, such as the first and second source electrodes 330S and 230S and first and second drain electrodes 330D and 230D, are formed. The first planarization layer 161 may include a photosensitive organic material. The first planarization layer 161 may be formed of an organic insulating material, such as polyacrylate and polyimide, but embodiments of the disclosure are not limited thereto.

A hole exposing the first drain electrode 330D is formed by patterning the first planarization layer 161 through an exposure and developing process. In the patterning process for forming the hole, the first planarization layer 161 in the pad area PA may be removed.

Then, a connection electrode 500 connected to the first drain electrode 330D through the hole is formed. The connection electrode 500 may be formed by depositing a metal material on the first planarization layer 161, followed by patterning using photolithography. The metal material used as a material of the connection electrode 500 may include aluminum (Al).

Subsequently, a second planarization layer 162 covering the connection electrode 500 is formed on the entire substrate including the display area DA and the non-display area NDA. For example, the second planarization layer 162 may planarize one surface of the substrate 110 where the metal electrode, such as the connection electrode 500, is formed.

The second planarization layer 162 may be formed of the same material as the first planarization layer 161. The second planarization layer 162 may include a photosensitive organic material. The second planarization layer 162 may be formed of an organic insulating material, such as polyacrylate and polyimide.

A hole exposing the connection electrode 500 is formed by patterning the second planarization layer 162 through an exposure and developing process. In the patterning process for forming the hole, the second planarization layer 162 in the pad area PA may be removed.

Then, the first electrode 610 of the light emitting element ED connected to the connection electrode 500 through the hole is formed. The first electrode 610 may be formed by depositing a metal material on the second planarization layer 162, followed by patterning using photolithography. The metal material used as the material of the first electrode 610 may be formed of at least one of silver (Ag), aluminum (Al), gold (Au), molybdenum (Mo), tungsten (W), chromium (Cr), or alloys thereof. For example, the first electrode 610 may have a three-layer structure of silver (Ag)/lead (Pb)/copper (Cu), but is not limited thereto.

The etching process for forming the first electrode 610 is performed while the first pad electrode 322 is covered with the second inter-layer insulation layer 150. Since the first electrode 610 is formed by etching the metal material while the first pad electrode 322 is covered with the second inter-layer insulation layer 150, no metal scum forms during the etching process.

Figure 5D:
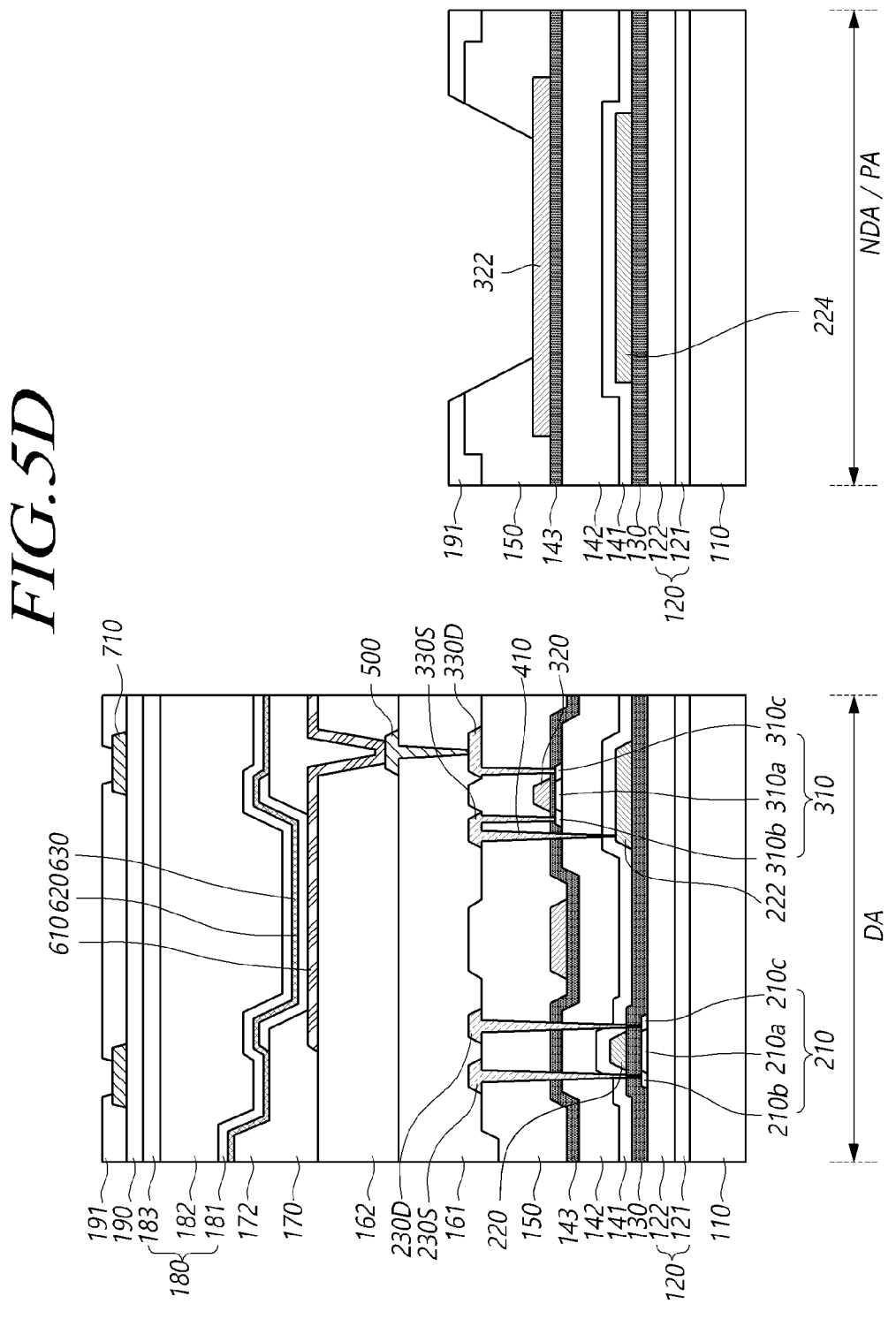

Referring to FIG. 5D, the bank layer 170 having a bank hole exposing the first electrode 610 corresponding to the emission area and a spacer 172 are formed on the second planarization layer 162 of the display area DA. The light emitting layer 620 is formed on the first electrode 610 exposed through the bank hole, the bank layer 170, and the spacer 172. The second electrode 630 is formed on the light emitting layer 620. Then, the encapsulation layer 180 covering the light emitting element ED is formed in the display area DA, and the touch buffer layer 190 is formed on the encapsulation layer 180.

Then, the first touch sensor layer 710 is formed on the touch buffer layer 190 of the display area DA.

Subsequently, the touch insulation layer 191 is formed on the touch buffer layer 190 of the display area DA and the second inter-layer insulation layer 150 of the pad area PA. The touch insulation layer 191 may be formed of an inorganic insulating material, such as silicon oxide ($SiO_2$).

Then, a hole exposing the first touch sensor layer 710 is formed in the touch insulation layer 191 of the display area DA. In the process of forming a hole in the touch insulation layer 191 of the display area DA, an opening overlapping the first pad electrode 322 is formed in the touch insulation layer 191 of the pad area PA. Then, an opening exposing a portion of the first pad electrode 322 is formed in the second inter-layer insulation layer 150 under the opening of the touch insulation layer 191.

Referring back to FIG. 4, the second touch sensor layer 720 connected to the first touch sensor layer 710 through the hole is formed in the display area DA. When the second touch sensor layer 720 is formed in the display area DA, the second pad electrode 722 of the display pad is formed in the pad area PA. The second pad electrode 722 may be formed together with the second touch sensor layer 720 in the process of forming the second touch sensor layer 720 in the display area DA. Accordingly, the second pad electrode 722 may be formed of the same material as the second touch sensor layer 720 of the display area DA.

The second touch sensor layer 720 and the second pad electrode 722 may be formed of a metal material. The metal material may be formed in a single-layer or multi-layer structure using a metal with good corrosion or acid resistance or electric conductivity, such as Al, Ti, Cu, or Mo. For example, the metal material may be formed in a stacked three-layer structure, such as Ti/Al/Ti or Mo/Al/Mo.

Thereafter, the planarization layer 192 covering the second touch sensor layer 720 is formed on the touch insulation layer 191 of the display area DA.

Figure 6:
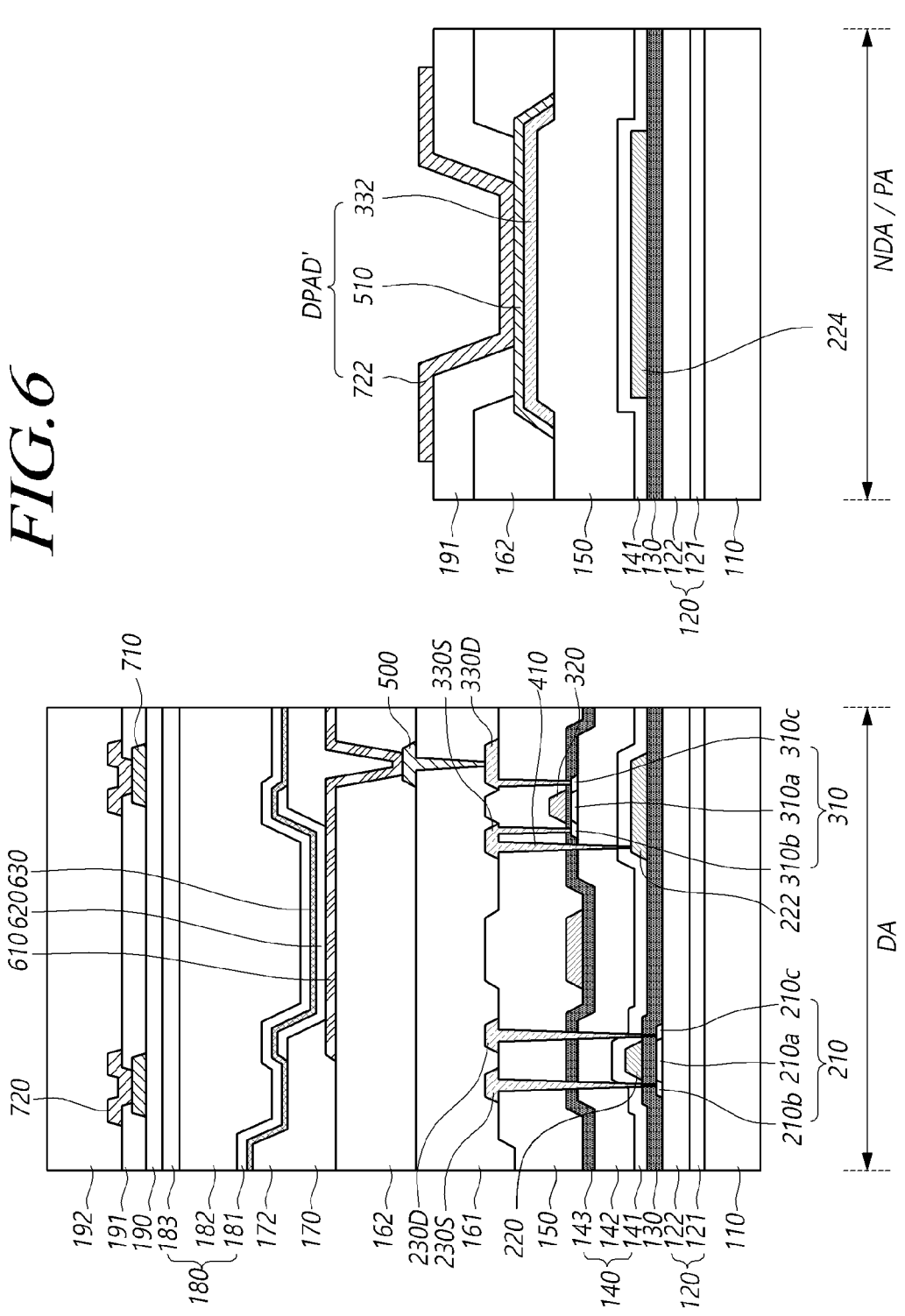
FIG. 6 is a cross-sectional view illustrating a pad area of an organic light emitting display device according to a first experimental example of the disclosure.

FIG. 6 is a cross-sectional view illustrating a pad area of an organic light emitting display device according to a first experimental example of the disclosure.

Referring to FIG. 6, a pad area PA of an organic light emitting display device according to the first experimental example includes the substrate 110, the lower buffer layer 120, the second gate insulation layer 130, the dummy pad electrode 224, the first inter-layer insulation layer 141, the second inter-layer insulation layer 150, a first pad electrode 332, a second pad electrode 510, the second planarization layer 162, the touch insulation layer 191, and a third pad electrode 722.

The display pad DPAD' may include the first pad electrode 332, the second pad electrode 510, and the third pad electrode 722.

The first pad electrode 332 may be formed together with the first and second source electrodes 330S and 230S and the first and second drain electrodes 330D and 230D when the first and second source electrodes 330S and 230S and the first and second drain electrodes 330D and 230D are formed in the display area DA. The second pad electrode 510 may be formed together with the connection electrode 500 when the connection electrode 500 is formed in the display area DA. The third pad electrode 722 may be formed together with the second touch sensor layer 720 when the second touch sensor layer 720 is formed in the display area DA.

Unlike the previous embodiments of the disclosure, in the organic light emitting display device according to the first experimental example, the first pad electrode 332 is formed on the same layer as the first and second source electrodes 330S and 230S and the first and second drain electrodes 330D and 230D, and the second pad electrode 510 is formed on the same layer as the connection electrode 500.

In the process of forming a hole in the second planarization layer 162 of the display area DA to connect the first electrode 610 of the light emitting element ED with the connection electrode 500, an opening exposing the second pad electrode 510 is formed in the second planarization layer 162 of the pad area PA. Since the second planarization layer 162 covering the connection electrode 500 and the second pad electrode 510 is formed of a photosensitive organic material and may be patterned only once, an opening is formed in the pad area PA in the process of forming a hole in the display area DA.

To form the first electrode 610 of the light emitting element ED in the display area DA after forming the hole and the opening in the second planarization layer 162, a metal film is formed on the second planarization layer 162, and an etching process is performed to pattern the metal film. Since the metal film etching process is performed with the second pad electrode 510 exposed through the opening, metal scum may form due to the Galvanic effect between the metal material (e.g., Al) used as the material of the second pad electrode 510 and the metal material (e.g., Ag) used as the material of the first electrode 610, shorting the first electrode 610 and second electrode 630 of the light emitting element ED and causing dark spots.

Meanwhile, in the first experimental example, the edge of the second pad electrode 510 is covered with the second planarization layer 162 that is on the second pad electrode 510. Since the second planarization layer 162 is an organic insulating material, and the second inter-layer insulation layer 150 disposed under the second planarization layer 162 and the touch insulation layer disposed over the second planarization layer 162 are inorganic insulating materials, detachment may occur due to low adhesivity between the second inter-layer insulation layer 150 and the second planarization layer 162 and between the second planarization layer 162 and the touch insulation layer 191 is low, causing the pad electrodes 332, 510, and 722 constituting the display pad DPAD' to peel off, with the result of failure in transfer of the signal from the driving IC mounted on the display pad DPAD' to the display area.

Figure 7:
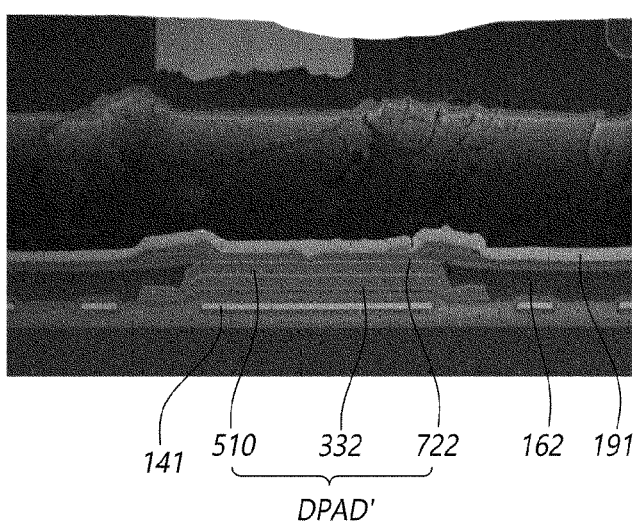
FIG. 7 is a scanning electron microscope (SEM) photo showing a display pad defect in an organic light emitting display device according to the first experimental example of the disclosure.
Figure 8:
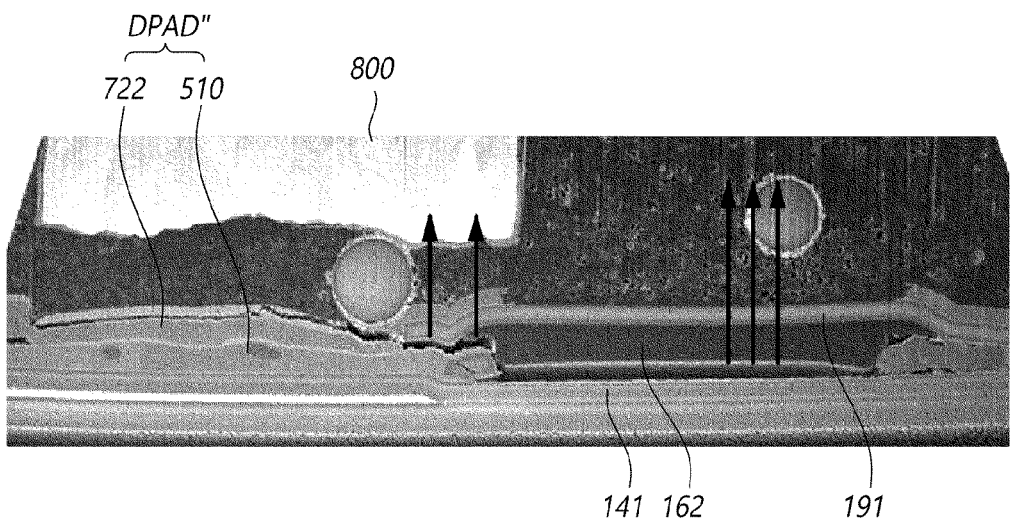
FIG. 8 is an SEM photo showing a display pad defect in an organic light emitting display device according to a second experimental example of the disclosure.

FIG. 7 is an SEM photo illustrating defects according to the first experimental example, and FIG. 8 is an SEM photo illustrating defects according to the second experimental example.

FIG. 7 illustrates a case in which the display pad DPAD' is formed by stacking the first pad electrode 332, the second pad electrode 510, and the third pad electrode 722, and FIG. 8 illustrates a case in which the display pad DPAD" is formed by stacking the second pad electrode 510 and the third pad electrode 722.

Referring to FIGS. 7 and 8, it may be identified that the second planarization layer 162 peels off the first inter-layer insulation layer 141 and lifts, pushing the third pad electrode 722 up and causing the third pad electrode 722 to peel off the second pad electrode 510.

Referring back to FIG. 4, according to embodiments of the disclosure, the first pad electrode 322 of the display pad is formed on the same layer as the first gate electrode 320 of the first transistor T1, and the edge of the first pad electrode 322 is clad (overlapping and in direct contact) with the second inter-layer insulation layer 150 formed of an inorganic insulating material, increasing the adhesivity between the insulation layer cladding the edge of the first pad electrode 322 and the first gate insulation layer 143 thereunder, formed of an inorganic insulating material, and the touch insulation layer 191 there above, and hence preventing the insulation layers from peeling off and lifting around the display pad DPAD. It is thus possible to prevent the pad electrodes of the display pad DPAD from peeling off due to the lifting of the insulation layers around the display pad DPAD and resultant failure in transfer of the signal from the driving IC 800 mounted on the display pad DPAD to the display area.

Further, since the first pad electrode 322 of the display pad is formed of the same material, on the same layer, as the first gate electrode 320 of the first transistor T1, and the etching process for forming the first electrode 610 of the light emitting element ED is performed with the first pad electrode 322 covered with the second inter-layer insulation layer 150, it is possible to prevent metal scum during the etching process for forming the first electrode 610 and resultantly a short-circuit between the first electrode 610 and second electrode 630 of the light emitting element ED and dark spots which may occur due to metal scum.

The above-described organic light emitting display device according to embodiments of the disclosure may be briefly described again below.

According to embodiments of the disclosure, there may be provided an organic light emitting display device comprising a first inorganic insulation layer disposed on a substrate including a display area and a pad area, a first gate electrode and a first pad electrode disposed on the first inorganic insulation layer, the first gate electrode positioned in the display area, and the first pad electrode positioned in the pad area, a second inorganic insulation layer covering the first gate electrode and the first pad electrode and having an opening exposing at least a portion of the first pad electrode, an organic insulation layer disposed on the second inorganic insulation layer in the display area, a light emitting element disposed on the organic insulation layer; an encapsulation layer covering the light emitting element, a touch sensor layer disposed on the encapsulation layer, a second pad electrode disposed on the second inorganic insulation layer in the pad area and connected to the first pad electrode through the opening, and a display pad including the first pad electrode and the second pad electrode.

According to embodiments of the disclosure, there may be provided the organic light emitting display device further comprising a second transistor disposed on the substrate, wherein the first inorganic insulation layer includes a first inter-layer insulation layer covering a second gate electrode of the second transistor, a buffer layer disposed on the first inter-layer insulation layer, and a gate insulation layer of the first transistor disposed on the buffer layer.

According to embodiments of the disclosure, there may be provided the organic light emitting display device, wherein the second inorganic insulation layer contacts the gate insulation layer of the first transistor.

According to embodiments of the disclosure, there may be provided the organic light emitting display device, further comprising a dummy pad electrode overlapping the first pad electrode, wherein the dummy pad electrode is formed of the same material, on the same layer, as the second gate electrode.

According to embodiments of the disclosure, there may be provided the organic light emitting display device, wherein the second pad electrode is formed of the same material, on the same layer, as the touch sensor layer.

According to embodiments of the disclosure, there may be provided the organic light emitting display device further comprising a touch buffer layer disposed on the encapsulation layer in the display area and a touch insulation layer disposed on the touch buffer layer in the display area and the second inorganic insulation layer in the pad area, wherein the touch sensor layer and the second pad electrode are disposed on the touch insulation layer, and wherein the touch insulation layer has an opening connected with the opening of the second inorganic insulation layer.

According to embodiments of the disclosure, there may be provided an organic light emitting display device comprising a substrate including a display area and a pad area, a first inorganic insulation layer disposed on the substrate, a first pad electrode disposed on the first inorganic insulation layer in the pad area, a second inorganic insulation layer disposed on the first inorganic insulation layer and the first pad electrode and having an opening exposing at least a portion of the first pad electrode, a second pad electrode disposed on the second inorganic insulation layer and connected with the first pad electrode through the opening, and a display pad including the first pad electrode and the second pad electrode.

According to embodiments of the disclosure, there may be provided the organic light emitting display device, wherein a lower surface of the second inorganic insulation layer contacts an upper surface of the first inorganic insulation layer.

According to embodiments of the disclosure, there may be provided the organic light emitting display device further comprising a first gate electrode of a first transistor disposed between the first inorganic insulation layer and the second inorganic insulation layer in the display area, an organic insulation layer disposed on the second inorganic insulation layer, a light emitting element disposed on the organic insulation layer, an encapsulation layer covering the light emitting element, and a touch sensor layer disposed on the encapsulation layer.

According to embodiments of the disclosure, there may be provided the organic light emitting display device, wherein the first pad electrode is formed of the same material, on the same layer, as the first gate electrode.

According to embodiments of the disclosure, there may be provided the organic light emitting display device, wherein the second pad electrode is formed of the same material as the touch sensor layer.

According to embodiments of the disclosure, there may be provided the organic light emitting display device further comprising a second gate electrode of a second transistor disposed under the first inorganic insulation layer in the display area and a dummy pad electrode disposed under the first pad electrode in the pad area and overlapping the first pad electrode, wherein the dummy pad electrode is formed of the same material, on the same layer, as the second gate electrode.

According to embodiments of the disclosure, there may be provided the organic light emitting display device, wherein the first inorganic insulation layer includes a first inter-layer insulation layer disposed on the substrate in the display area and the pad area and covering the second gate electrode, a buffer layer disposed on the first inter-layer insulation layer, and a gate insulation layer of the first transistor disposed on the buffer layer.

According to embodiments of the disclosure, there may be provided the organic light emitting display device further comprising a touch buffer layer disposed on the encapsulation layer in the display area and a touch insulation layer disposed on the touch buffer layer and the second inorganic insulation layer in the pad area and having an opening connected with the opening of the second inorganic insulation layer, wherein the touch sensor layer and the second pad electrode are disposed on the touch insulation layer.

According to embodiments of the disclosure, there may be provided a method for manufacturing an organic light emitting display device, comprising forming a first inorganic insulation layer disposed on a substrate including a display area and a pad area, forming a first gate electrode on the first inorganic insulation layer in the display area and forming a first pad electrode on the first inorganic insulation layer in the pad area, forming a second inorganic insulation layer covering the first gate electrode and the first pad electrode on the first inorganic insulation layer, forming an organic insulation layer on the second inorganic insulation layer in the display area, forming a light emitting element on the organic insulation layer, forming an encapsulation layer covering the light emitting element, forming an opening exposing at least a portion of the first pad electrode in the second inorganic insulation layer of the pad area, and forming a touch sensor layer on the encapsulation layer in the display area and forming a second pad electrode connected to the first pad electrode through the opening on the second inorganic insulation layer in the pad area.

According to embodiments of the disclosure, there may be provided the method, wherein in forming the light emitting element, the first pad electrode is covered with the second inorganic insulation layer.

According to embodiments of the disclosure, there may be provided the method further comprising after forming the encapsulation layer and before forming the opening in the second inorganic insulation layer, forming a touch buffer layer on the encapsulation layer, forming a touch insulation layer on the touch buffer layer, and forming an opening in the touch insulation layer on the first pad electrode, wherein the opening of the second inorganic insulation layer is formed under the opening of the touch insulation layer.

According to embodiments of the disclosure, there may be provided an organic light emitting display device and manufacturing method thereof, in which the pad electrode of the display pad is formed on the same layer as the gate electrode of the first transistor (driving transistor), and the anode electrode of the light emitting element is patterned with the pad electrode of the display pad covered with the inorganic insulation layer on the gate electrode of the first transistor, thereby preventing metal scum from forming during the process of patterning the anode electrode and a short circuit between the anode electrode and cathode electrode of the light emitting element and resultant dark spots due to metal scum.

According to embodiments of the disclosure, there may be provided an organic light emitting display device and manufacturing method thereof, in which the inorganic insulation layers are disposed above and under the pad electrodes to prevent the insulation layers around the pad electrode from lifting, preventing the pad electrodes of the display pad from peeling off due to lifting, and thus preventing failure in transfer of the signal from the driving IC mounted on the display pad to the display area due to the peel-off of the pad electrodes.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. An organic light emitting display device, comprising:
   a first inorganic insulation layer in a display area and a pad area of a substrate;
   a first gate electrode of a first transistor and a first pad electrode on the first inorganic insulation layer, the first gate electrode in the display area and the first pad electrode in the pad area;
   a second inorganic insulation layer covering the first gate electrode in the display area and covering a portion of the first pad electrode in the pad area, the second inorganic insulation layer having an opening in the pad area;
   an organic insulation layer on the second inorganic insulation layer in the display area;
   a light emitting element on the organic insulation layer in the display area;
   an encapsulation layer covering the light emitting element in the display area;
   a touch sensor layer on the encapsulation layer in the display area;
   a second pad electrode on the second inorganic insulation layer and the first pad electrode in the pad area, the second pad electrode connected to the first pad electrode through the opening;
   a display pad including the first pad electrode and the second pad electrode; and
   a touch insulation layer on a portion of the touch sensor layer in the display area and on the second inorganic insulation layer in the pad area,
   wherein the second pad electrode is on the touch insulation layer and the second inorganic insulation layer in the pad area.

2. The organic light emitting display device of claim 1, further comprising:
   a second transistor on the substrate, the second transistor including a second gate electrode,
   wherein the first inorganic insulation layer includes:
   a first inter-layer insulation layer covering the second gate electrode of the second transistor;
   a buffer layer on the first inter-layer insulation layer; and
   a gate insulation layer in the display area and the pad area, the gate insulation layer between the first gate electrode of the first transistor and the buffer layer in the display area.

3. The organic light emitting display device of claim 2, wherein the second inorganic insulation layer contacts the gate insulation layer in the display area and the pad area.

4. The organic light emitting display device of claim 2, further comprising:
   a dummy pad electrode overlapping the first pad electrode in the pad area, the dummy pad electrode comprising a same material as the second gate electrode and on a same layer as the second gate electrode.

5. The organic light emitting display device of claim 1, wherein the second pad electrode comprises a same material as the touch sensor layer.

6. The organic light emitting display device of claim 1, further comprising:
   a touch buffer layer on the encapsulation layer in the display area,
   wherein the touch sensor layer is on the touch insulation layer in the display area, and wherein the touch insulation layer has an opening in the pad area that is connected with the opening of the second inorganic insulation layer.

7. An organic light emitting display device, comprising:
a substrate including a display area and a pad area;
a first inorganic insulation layer in the display area and the pad area of the substrate;
a first pad electrode on the first inorganic insulation layer in the pad area;
a second inorganic insulation layer on the first inorganic insulation layer and the first pad electrode in the pad area, the second inorganic insulation layer having an opening in the pad area;
a second pad electrode on the second inorganic insulation layer and the first pad electrode in the pad area, the second pad electrode connected with the first pad electrode through the opening;
a display pad including the first pad electrode and the second pad electrode; and
a touch insulation layer on the second inorganic insulation layer in the pad area,
wherein the second pad electrode is on the touch insulation layer and the second inorganic insulation layer in the pad area.

8. The organic light emitting display device of claim 7, wherein a lower surface of the second inorganic insulation layer is in contact with an upper surface of the first inorganic insulation layer.

9. The organic light emitting display device of claim 7, further comprising:
a first gate electrode of a first transistor in the display area, the first gate electrode between the first inorganic insulation layer and the second inorganic insulation layer in the display area;
an organic insulation layer on the second inorganic insulation layer in the display area;
a light emitting element on the organic insulation layer in the display area;
an encapsulation layer covering the light emitting element in the display area; and
a touch sensor layer on the encapsulation layer in the display area.

10. The organic light emitting display device of claim 9, wherein the first pad electrode comprises a same material as the first gate electrode and is on a same layer as the first gate electrode.

11. The organic light emitting display device of claim 9, wherein the second pad electrode comprises a same material as the touch sensor layer.

12. The organic light emitting display device of claim 9, further comprising:
a second gate electrode of a second transistor, the second gate electrode under the first inorganic insulation layer in the display area; and
a dummy pad electrode under the first pad electrode in the pad area and overlapping the first pad electrode, the dummy pad electrode comprising a same material as the second gate electrode and on a same layer as the second gate electrode.

13. The organic light emitting display device of claim 12, wherein the first inorganic insulation layer includes:
a first inter-layer insulation layer in the display area and the pad area, the first inter-layer insulation layer covering the second gate electrode in the display area;
a buffer layer on the first inter-layer insulation layer in the display area and the pad area; and a gate insulation layer between the first gate electrode of the first transistor and the buffer layer in the display area and the gate insulation layer on the buffer layer in the pad area.

14. The organic light emitting display device of claim 9, further comprising:
a touch buffer layer on the encapsulation layer in the display area,
wherein the touch insulation layer is on the touch buffer layer in the display area,
wherein the touch insulation layer has an opening in the pad area that is connected with the opening of the second inorganic insulation layer, and
wherein the touch sensor layer is on the touch insulation layer in the display area.

15. An organic light emitting display device comprising:
a substrate including a display area and a pad area;
a first inorganic insulation layer in the display area and the pad area;
a driving transistor in the display area, the driving transistor including a first gate electrode that is on the first inorganic insulation layer;
a second inorganic insulation layer on the first inorganic insulation layer in the display area and the pad area, the second inorganic insulation layer covering the first gate electrode in the display area;
a display pad in the pad area, the display pad including a first pad electrode on the first inorganic insulation layer in the pad area and a second pad electrode on the first pad electrode and the second inorganic insulation layer in the pad area, the second pad electrode connected with the first pad electrode through an opening in the second inorganic insulation layer in the pad area; and
a touch insulation layer on the second inorganic insulation layer in the pad area,
wherein the second pad electrode is on the touch insulation layer and the second inorganic insulation layer in the pad area.

16. The organic light emitting display device of claim 15, wherein the first pad electrode comprises a same material as the first gate electrode and is on a same layer as the first gate electrode.

17. A display device comprising:
a substrate including a display area and a pad area;
a first inorganic insulation layer in the display area and the pad area;
a driving transistor in the display area, the driving transistor including a gate electrode that is on the first inorganic insulation layer in the display area;
a second inorganic insulation layer on the first inorganic insulation layer in the display area and the pad area, the second inorganic insulation layer covering the gate electrode in the display area;
a light emitting element on the second inorganic insulation layer in the display area, the light emitting element connected to the driving transistor;
a touch sensor layer on the light emitting element in the display area;
a first pad electrode on the first inorganic insulation layer in the pad area and having ends that are covered by the second inorganic insulation layer in the pad area, the first pad electrode comprising a same material as the gate electrode of the driving transistor;
a second pad electrode on the second inorganic insulation layer in the pad area and connected with the first pad electrode via an opening in the second inorganic insulation layer in the pad area, the second pad electrode comprising a same material as the touch sensor layer; and a touch insulation layer on a portion of the touch sensor layer in the display area and on the second inorganic insulation layer in the pad area, wherein the second pad electrode is on the touch insulation layer and the second inorganic insulation layer in the pad area.

18. The display device of claim 17, wherein the first pad electrode is on a same layer as the gate electrode.

19. The display device of claim 17, wherein an opening in the touch insulation layer overlaps the opening in the second inorganic insulation layer, and wherein the second pad electrode is in contact with the first pad electrode through the opening in the touch insulation layer and the opening in the second inorganic insulation layer.

20. The display device of claim 17, further comprising:

a dummy pad electrode overlapping the first pad electrode and the second pad electrode in the pad area, the dummy pad electrode comprising a same material as a gate electrode of another transistor that is in the display area and on a same layer as the gate electrode of the other transistor.

* * * * *